US011932531B2

(12) United States Patent
Chen

(10) Patent No.: US 11,932,531 B2
(45) Date of Patent: Mar. 19, 2024

(54) CURVED CANTILEVER DESIGN TO REDUCE STRESS IN MEMS ACTUATOR

(71) Applicant: Taiwan Semiconductor Manufacturing Company, Ltd., Hsinchu (TW)

(72) Inventor: Ting-Jung Chen, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/694,083

(22) Filed: Mar. 14, 2022

(65) Prior Publication Data

US 2023/0219806 A1    Jul. 13, 2023

Related U.S. Application Data

(60) Provisional application No. 63/299,081, filed on Jan. 13, 2022.

(51) Int. Cl.
*B81B 3/00* (2006.01)
*B81C 1/00* (2006.01)
(Continued)

(52) U.S. Cl.
CPC ........ *B81B 3/0072* (2013.01); *B81C 1/00666* (2013.01); *H04N 23/54* (2023.01);
(Continued)

(58) Field of Classification Search
CPC ........... B81B 3/0072; B81B 2203/0118; B81B 2203/019; B81B 2203/0307;
(Continued)

(56) References Cited

U.S. PATENT DOCUMENTS 7,100,446 B1 * 9/2006 Acar .................. G01C 19/5719
73/504.12
10,831,093 B1 * 11/2020 Lablans ............... H04N 23/698
(Continued)

FOREIGN PATENT DOCUMENTS

EP           3770111 A1    1/2021
JP        2003204470 A    7/2003
(Continued)

OTHER PUBLICATIONS

U.S. Appl. No. 17/181,624, filed Feb. 22, 2021.
U.S. Appl. No. 17/176,353, filed Feb. 16, 2021.

*Primary Examiner* — Chiawei Chen
(74) *Attorney, Agent, or Firm* — Eschweiler & Potashnik, LLC

(57) ABSTRACT

The present disclosure relates to an integrated chip structure including a MEMS actuator. The MEMS actuator includes an anchor having a first plurality of branches extending outward from a central region of the anchor. The first plurality of branches respectively include a first plurality of fingers. A proof mass surrounds the anchor and includes a second plurality of branches extending inward from an interior sidewall of the proof mass. The second plurality of branches respectively include a second plurality of fingers interleaved with the first plurality of fingers as viewed in a top-view. One or more curved cantilevers are coupled between the proof mass and a frame wrapping around the proof mass. The one or more curved cantilevers have curved outer surfaces having one or more inflection points as viewed in the top-view.

20 Claims, 18 Drawing Sheets

(51) Int. Cl.
*G02B 7/02* (2021.01)
*H04N 23/54* (2023.01)
*H04N 23/68* (2023.01)

(52) U.S. Cl.
CPC .... *H04N 23/687* (2023.01); *B81B 2203/0118* (2013.01); *B81B 2203/019* (2013.01); *B81B 2203/0307* (2013.01); *B81C 2201/0105* (2013.01); *B81C 2201/0178* (2013.01); *G02B 7/021* (2013.01)

(58) Field of Classification Search
CPC ........ B81C 1/00666; B81C 2201/0105; B81C 2201/0178; H04N 23/54; H04N 23/687; G02B 7/021
See application file for complete search history.

(56) References Cited

U.S. PATENT DOCUMENTS

| | | |
|---|---|---|
| 2003/0076421 A1 | 4/2003 | Dutta |
| 2006/0082433 A1 | 4/2006 | Parsons |
| 2010/0133952 A1 | 6/2010 | Bang et al. |
| 2013/0201392 A1* | 8/2013 | Gutierrez ............. G02B 27/646 348/374 |
| 2014/0028887 A1* | 1/2014 | Azuma ................... G03B 3/10 348/333.01 |
| 2014/0028897 A1* | 1/2014 | Azuma ................. H04N 23/57 348/357 |
| 2014/0165724 A1* | 6/2014 | Krylov ................. G01P 15/125 73/514.15 |
| 2015/0232324 A1* | 8/2015 | Despont ................ B81C 99/006 716/119 |
| 2016/0152202 A1 | 6/2016 | Rytkonen et al. |
| 2017/0152135 A1* | 6/2017 | Hennes ................. G01P 15/125 |
| 2017/0341928 A1 | 11/2017 | Liu et al. |
| 2021/0024350 A1 | 1/2021 | Dosev et al. |

FOREIGN PATENT DOCUMENTS

| | | |
|---|---|---|
| KR | 20190019963 A | 2/2019 |
| TW | 201625953 A | 7/2016 |
| WO | 2009057990 A2 | 5/2009 |

* cited by examiner

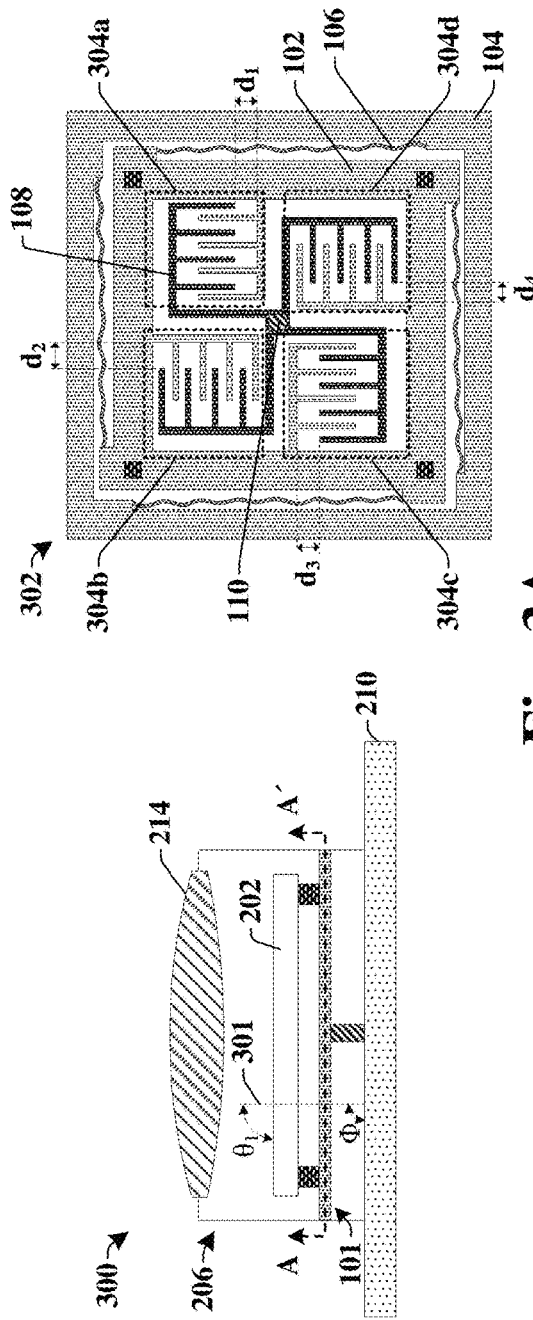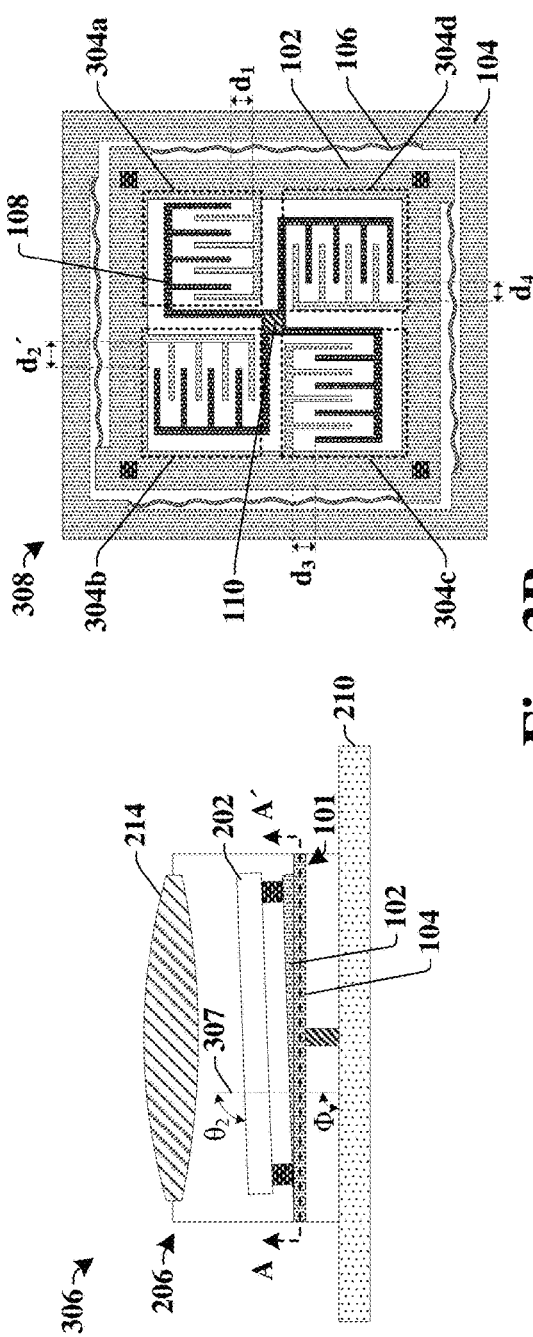
Fig. 3A
Fig. 3B

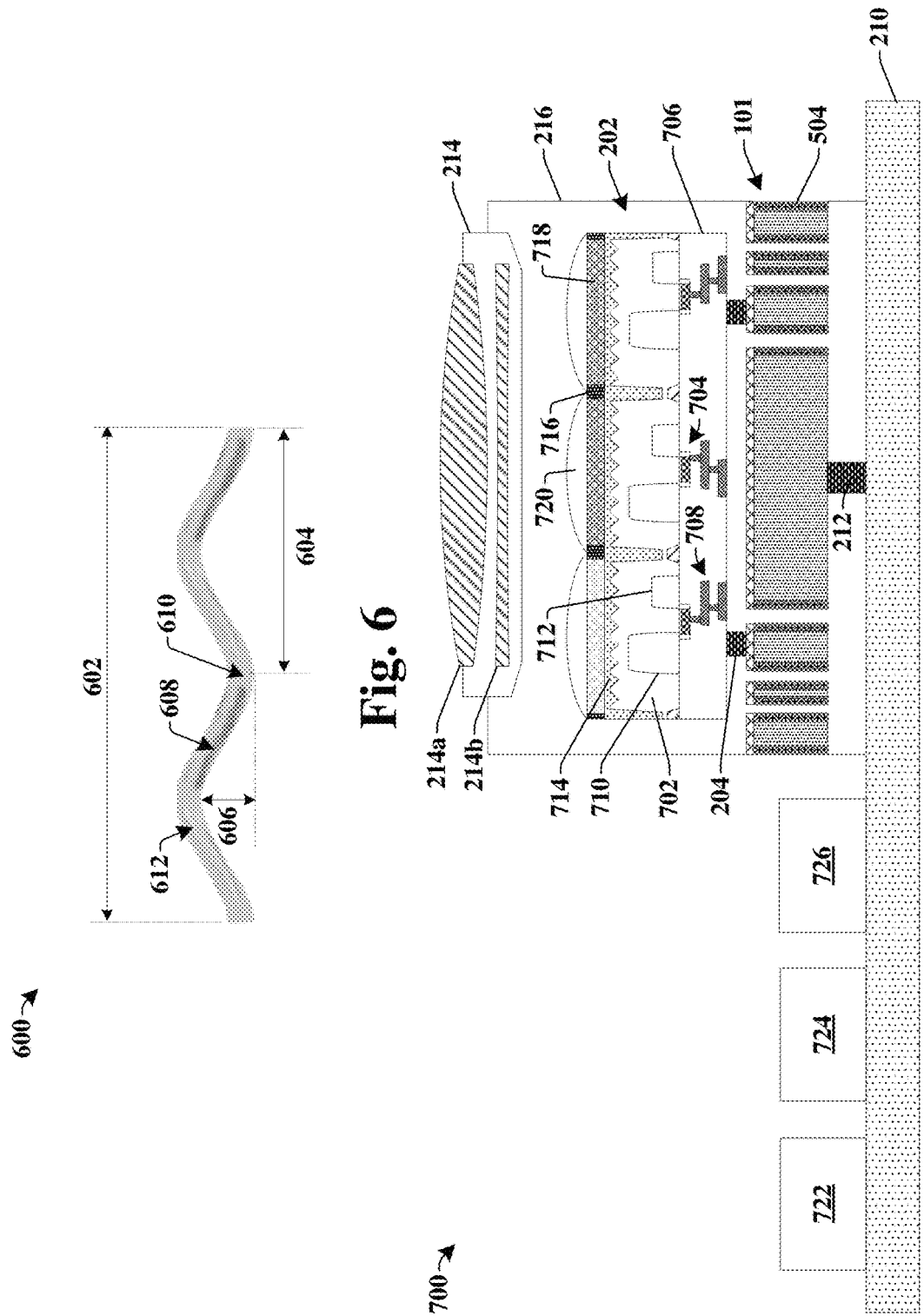

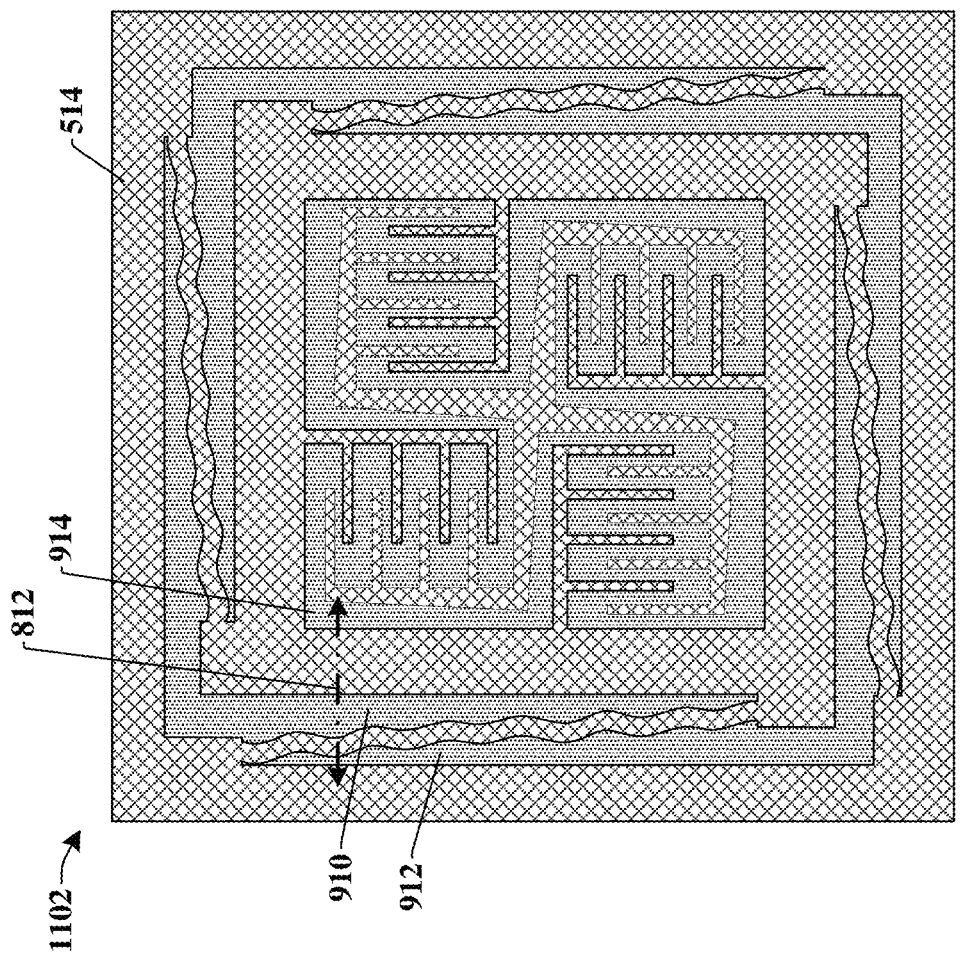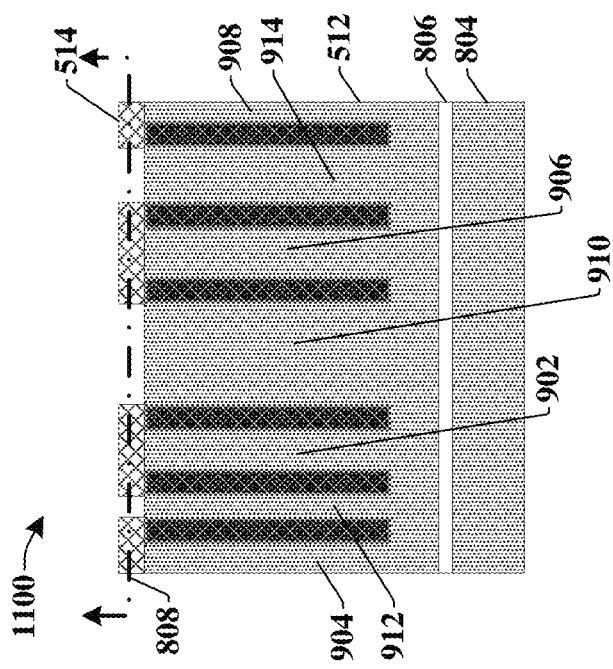
Fig. 11

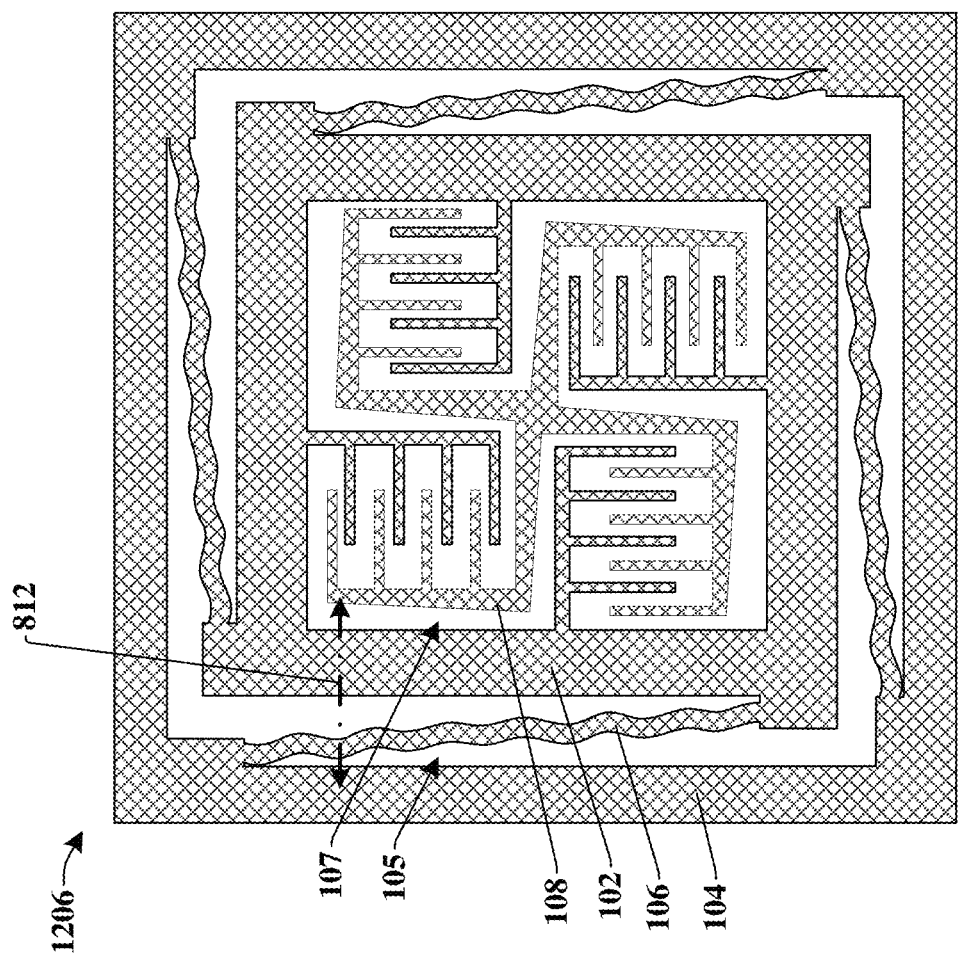
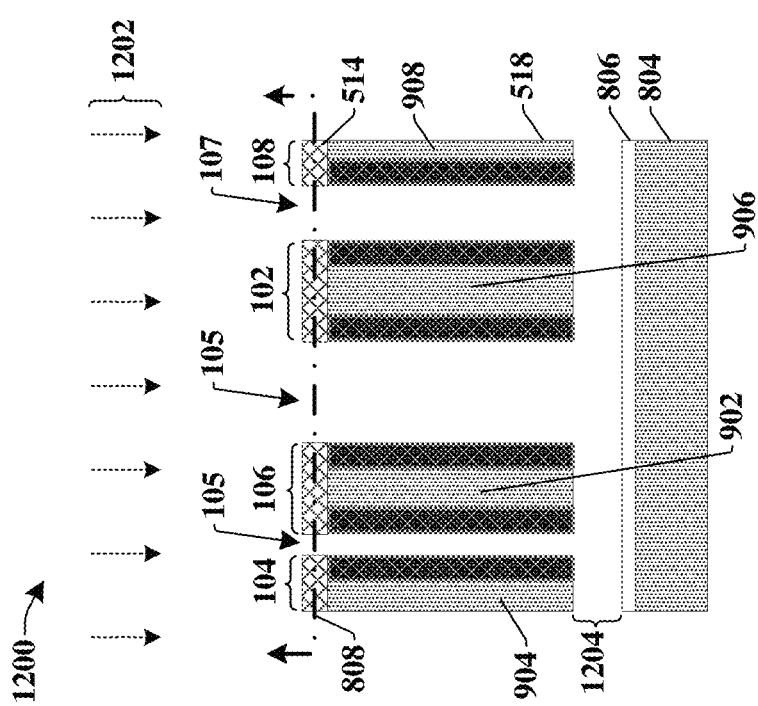
Fig. 12

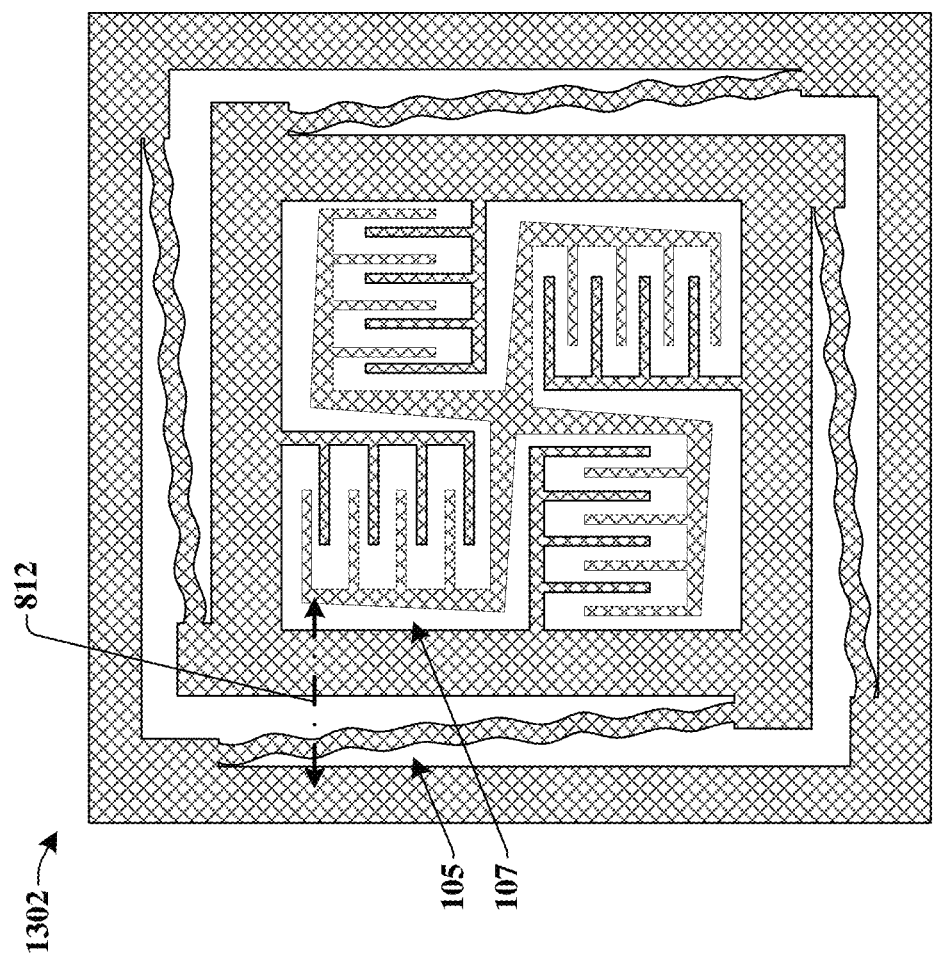
Fig. 13
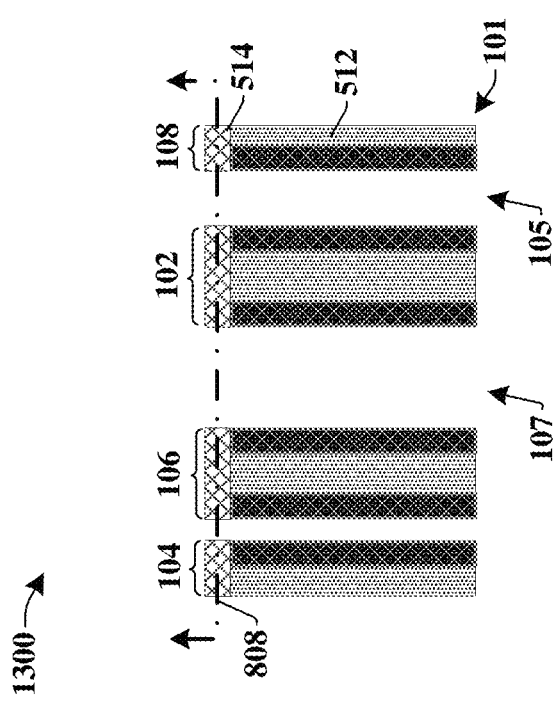

CURVED CANTILEVER DESIGN TO REDUCE STRESS IN MEMS ACTUATOR

REFERENCE TO RELATED APPLICATION

This Application claims the benefit of U.S. Provisional Application No. 63/299,081, filed on Jan. 13, 2022, the contents of which are hereby incorporated by reference in their entirety.

BACKGROUND

Microelectromechanical systems, or MEMS, is a technology that integrates miniaturized mechanical and electromechanical elements on an integrated chip. MEMS devices are often made using micro-fabrication techniques. In recent years, MEMS devices have found a wide range of applications. For example, MEMS devices are found in hand held devices (e.g., accelerometers, gyroscopes, digital compasses), pressure sensors (e.g., crash sensors), micro-fluidic elements (e.g., valves, pumps), optical switches (e.g., mirrors), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3B illustrates some embodiments showing operation of an actuator having one or more curved cantilevers within the disclosed integrated chip structure.

FIG. 6 illustrates a top-view showing some embodiments of a disclosed curved cantilever for a MEMS actuator.

FIG. 7 illustrates some additional embodiments of an integrated chip structure comprising a MEMS actuator having a proof mass coupled to a frame by one or more curved cantilevers.

FIGS. 8-17 illustrate cross-sectional views showing some embodiments of a method of forming an integrated chip structure comprising a MEMS actuator having a proof mass coupled to a frame by one or more curved cantilevers.

DETAILED DESCRIPTION

Figure 1A:
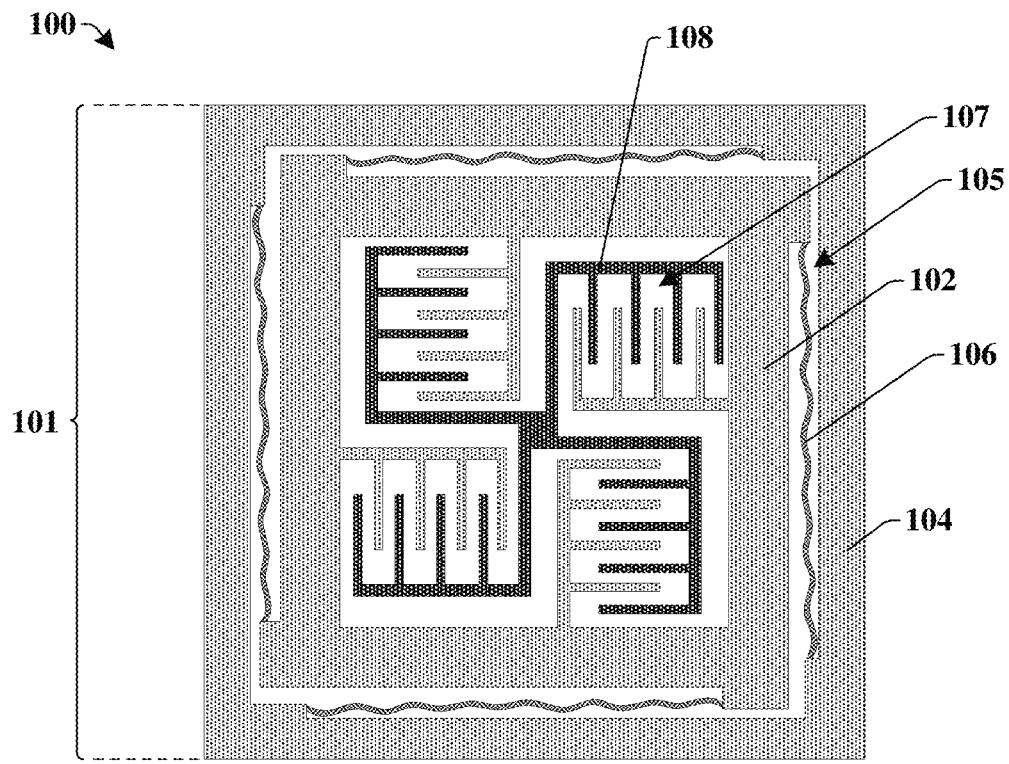
FIGS. 1A-1B illustrate some embodiments of an integrated chip structure comprising a MEMS actuator having a proof mass coupled to a frame by one or more curved cantilevers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many modern day cameras comprise image stabilization technology. Image stabilization technology is a technology that reduces blurring associated with a motion (e.g., hand shaking) of an imaging device during exposure. Typically, blurring occurs when an image sensor moves during exposure. The movement causes light that is initially incident upon one pixel to travel to adjacent pixels, thereby causing blurring. As resolutions of cameras increase, the size of pixel regions within the cameras decrease making blurring caused by movement (e.g., hand jitter) more evident in captured images.

Optical image stabilization (OIS) is one form of image stabilization technology that can be used to mitigate blurring due to involuntary camera movement (e.g., camera shaking). OIS senses a movement of a camera and subsequently compensates for the movement by controlling an optical path between a target and an image sensor. The optical path may be controlled by moving mechanical parts of a camera to ensure that light arrives at a same pixel of an image sensor even when movement occurs.

Some cameras may comprise OIS systems having an image sensor integrated chip disposed on a MEMS actuator. The MEMS actuator is configured to move the image sensor integrated chip in a manner that compensates for movement of the camera. The MEMS actuator may comprise a frame that is coupled to a package box. A proof mass is coupled to the frame by way of one or more straight cantilevers. The proof mass is further coupled to the image sensor integrated chip and is configured to move during operation to compensate for the movement of the camera. It has been appreciated that during extreme movements of the camera, a stress on the one or more straight cantilevers may be large. For example, when being dropped from a height of approximately 1.5 meters, the one or more straight cantilevers may undergo a stress that is on the order of $10^6$ MPa (Mega Pascals). Such large stress may break the one or more straight cantilevers of the MEMS actuator, thereby rending the OIS system of the camera inoperable.

The present disclosure relates to an integrated chip structure comprising a MEMS (microelectromechanical systems) actuator having a proof mass coupled to a frame by one or more curved cantilevers. In some embodiments, the MEMS actuator comprises an anchor that is coupled to a base substrate. The anchor comprises a first plurality of branches respectively having a first plurality of fingers. A proof mass surrounds the anchor and comprises a second plurality of branches respectively having a second plurality of fingers that are interleaved with the first plurality of fingers as viewed in a top-view. One or more curved cantilevers are coupled between the proof mass and a frame, which wraps around the proof mass. The one or more curved cantilevers comprise curved outer surfaces having one or more inflection points as viewed in the top-view. The curved outer surfaces of the one or more curved cantilevers reduce a stress on the one or more curved cantilevers during extreme movements of the MEMS actuator. By reducing a stress on the one or more curved cantilevers during extreme movements, the disclosed MEMS actuator is able to provide for an improved reliability under real world conditions (e.g., when dropped).

FIG. 1A illustrates a top-view 100 of some embodiments of a MEMS actuator 101 having a proof mass coupled to a frame by one or more curved cantilevers.

The MEMS actuator 101 comprises a proof mass 102 separated from a frame 104 by one or more first openings 105. One or more curved cantilevers 106 traverse the one or more first openings 105 to couple the proof mass 102 to the frame 104. In some embodiments, the frame 104 wraps around the proof mass 102 in a first continuous loop (e.g., a first unbroken loop). The proof mass 102 is further separated from an anchor 108 by one or more second openings 107. In some embodiments, the proof mass 102 wraps around the anchor 108 in a second continuous loop (e.g., a second unbroken loop). In some embodiments, the MEMS actuator 101 comprises an electrostatic actuator. In some embodiments, the MEMS actuator 101 comprises a comb actuator (e.g., an electrostatic comb actuator), such as polysilicon suspended comb. In such embodiments, the anchor 108 has a first plurality of fingers that are interleaved with a second plurality of fingers of the proof mass 102.

The one or more curved cantilevers 106 comprise curved outer surfaces (e.g., curved outer sidewalls). In some embodiments, the curved outer surfaces may comprise a winding shape as viewed in the top-view 100 of the MEMS actuator 101. In some embodiments, the one or more curved cantilevers 106 may comprise a plurality of turning points separated by a plurality of inflection points. For example, the one or more curved cantilevers 106 may respectively comprise a first maximum turning point (e.g., a local peak) on a side of a curved cantilever facing the proof mass 102, a first minimum turning point (e.g., a local trough) on the side of the curved cantilever facing the proof mass 102, and an inflection point between the first maximum turning point and the first minimum turning point. In some embodiments, the one or more curved cantilevers may respectively comprise multiple maximum turning points, multiple minimum turning points, and multiple inflection points on opposing sides of a curved cantilever.

It has been appreciated that the curved outer surfaces (e.g., sidewalls) reduce a localized stress on the one or more curved cantilevers 106 during movement of the MEMS actuator 101. For example, when being dropped from a height of approximately 1.5 meters, the one or more curved cantilevers 106 may undergo a stress that is at least two orders of magnitude smaller than that of straight cantilevers (e.g., that is on the order of $10^4$ MPa). By reducing localized stress on the one or more curved cantilevers 106, a reliability of the MEMS actuator 101 can be improved.

Figure 1B:
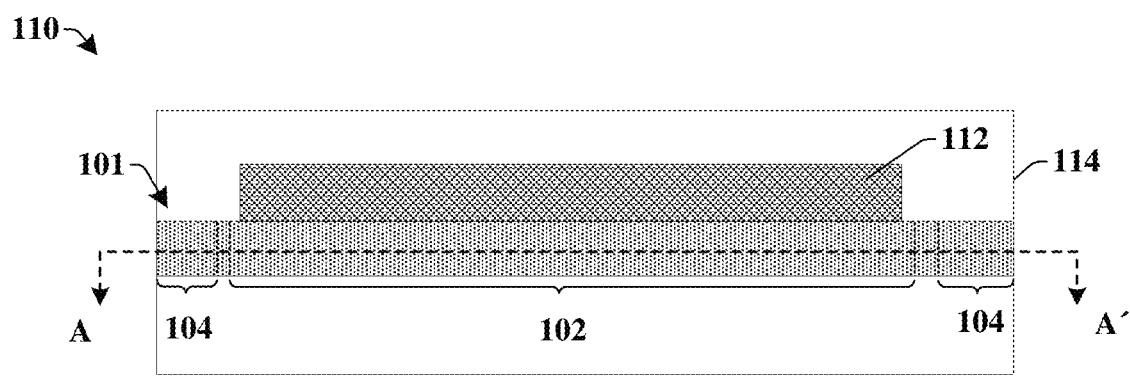

FIG. 1B illustrates a cross-sectional view of some embodiments of an integrated chip structure 110 comprising a MEMS actuator 101 having a proof mass 102 coupled to a frame 104 by one or more curved cantilevers. In some embodiments, the top-view of the MEMS actuator 101 shown in FIG. 1A may be taken along cross-sectional line A-A' of FIG. 1B.

The integrated chip structure 110 comprises a semiconductor structure 112 disposed onto the MEMS actuator 101. In various embodiments, the semiconductor structure 112 may comprise an optical sensor (e.g., an image sensor integrated chip), an optical component (e.g., a mirror, lens, or the like), a sensor (e.g., for an atomic force microscope), an RF (radio frequency) switch, or the like.

In some embodiments, the semiconductor structure 112 is coupled to the proof mass 102 of the MEMS actuator 101. In some embodiments, the frame 104 of the MEMS actuator is coupled to a housing 114 that surrounds the MEMS actuator 101 and the semiconductor structure 112. During operation, the proof mass 102 is configured to move in response to an applied signal to spatially move the semiconductor structure 112. In various embodiments, the proof mass of the MEMS actuator 101 can move in a manner that changes a height and/or a pitch (e.g., slope) of the semiconductor structure 112. The movements can be detected by a capacitive read-out scheme.

Figure 2A:
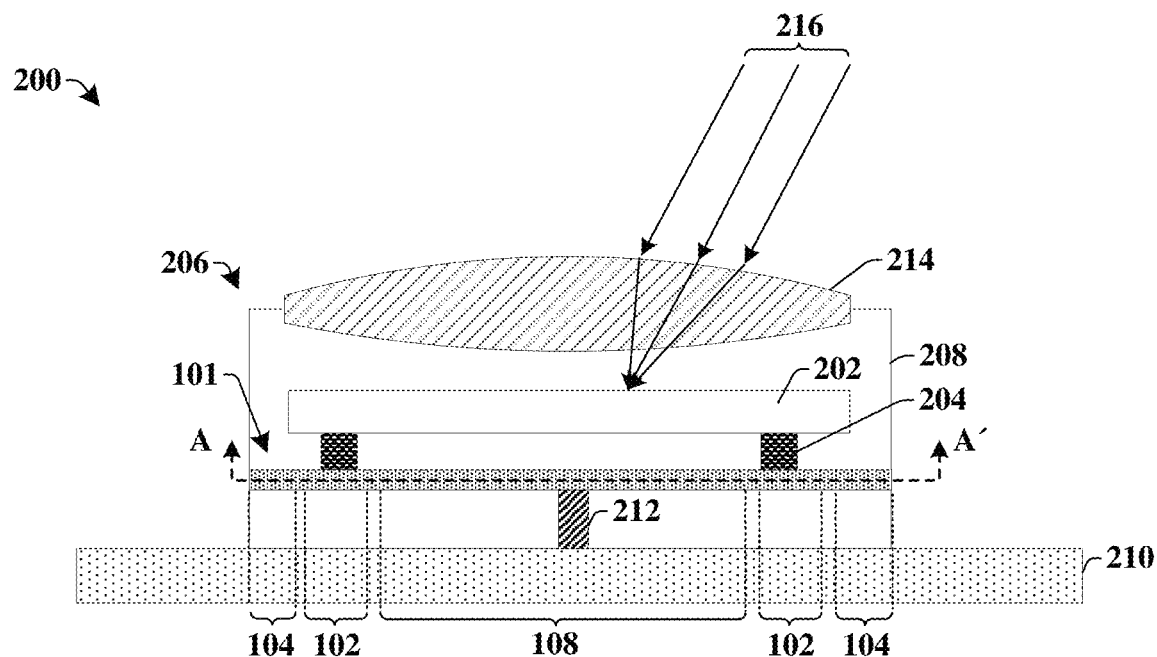
FIGS. 2A-2B illustrate some additional embodiments of an integrated chip structure comprising a MEMS actuator having a proof mass coupled to a frame by one or more curved cantilevers.

FIG. 2A illustrates a cross-sectional view some additional embodiments of an integrated chip structure 200 comprising a MEMS actuator having a proof mass coupled to a frame by one or more curved cantilevers.

The integrated chip structure 200 comprises a MEMS actuator 101 having a proof mass 102 surrounded by a frame 104 and an anchor 108 surrounded by the proof mass 102. An image sensor integrated chip 202 is disposed on the proof mass 102. In some embodiments, the image sensor integrated chip 202 may be coupled to the proof mass 102 by way of one or more first coupling elements 204. In some embodiments, the one or more first coupling elements 204 may comprise conductive structures (e.g., solder bumps, vertical wire bonds, a wire stud, or the like) and/or a polymer. In some embodiments, the one or more first coupling elements 204 may comprise a conducive structure (e.g., a vertical wire bond) surrounded by an encapsulant (e.g., an epoxy resin, an epoxy resin with filler, epoxy acrylate, a polymer, or the like).

The image sensor integrated chip 202 comprises one or more pixels regions respectively including an image sensing element configured to convert electromagnetic radiation (e.g., visible light, ultraviolet radiation, or the like) into an electrical signal. In some embodiments, the image sensor integrated chip 202 may comprise a CMOS (complementary metal-on-oxide) image sensor (CIS). In some embodiments, the image sensing element may comprise a photodiode, a photodetector, or the like.

In some embodiments, the MEMS actuator 101 and the image sensor integrated chip 202 are disposed within a package box 206 (e.g., a camera module). In such embodiments, the package box 206 comprises a housing 208 that surrounds the MEMS actuator 101 and the image sensor integrated chip 202. In some embodiments, the housing 208 is attached to a base substrate 210. In some embodiment, the base substrate 210 may comprise a printed circuit board (PCB). The frame 104 of the MEMS actuator 101 is coupled to the housing 208 of the package box 206. In some embodiments, the frame 104 is laterally and physically coupled to one or more sidewalls of the housing 208. By further coupling the frame 104 to the proof mass 102 by way of the one or more curved cantilevers, the one or more curved cantilevers are able to provide support for the proof mass 102 when the package box 206 is moved (e.g., when the package box 206 is dropped), thereby protecting the proof mass 102 from excessive unwanted movement that may damage the proof mass 102.

In various embodiments, the MEMS actuator 101 may be further coupled to the base substrate 210 by way of one or more second coupling elements 212. In some embodiments, the anchor 108 of the MEMS actuator 101 may be attached to the base substrate 210 by the one or more second coupling elements 212. In some embodiments, the one or more second coupling elements 212 may comprise conductive structures (e.g., solder bumps, vertical wire bonds, a wire stud, or the like) and/or a polymer. In some embodiments, the one or more second coupling elements 212 may comprise a conducive structure (e.g., a vertical wire bond) surrounded by an encapsulant (e.g., an epoxy resin, an epoxy resin with filler, epoxy acrylate, a polymer, or the like). In some embodiments, the anchor 108 of the MEMS actuator 101 may be rigidly coupled to the base substrate 210 by the one or more second coupling elements 212. In some additional embodiments (not shown), one or more additional coupling elements (e.g., vertical wire bonds, wire bonds, or the like) may be configured to electrically couple the proof mass 102 and/or the image sensor integrated chip 202 to the base substrate 210.

An optical system 214 is arranged along an upper surface of the package box 206 and over the image sensor integrated chip 202. The optical system 214 comprises one or more lenses and/or mirrors. During operation, the optical system 214 is configured to focus incident radiation 216 onto one or more pixel regions of the image sensor integrated chip 202.

Figure 2B:
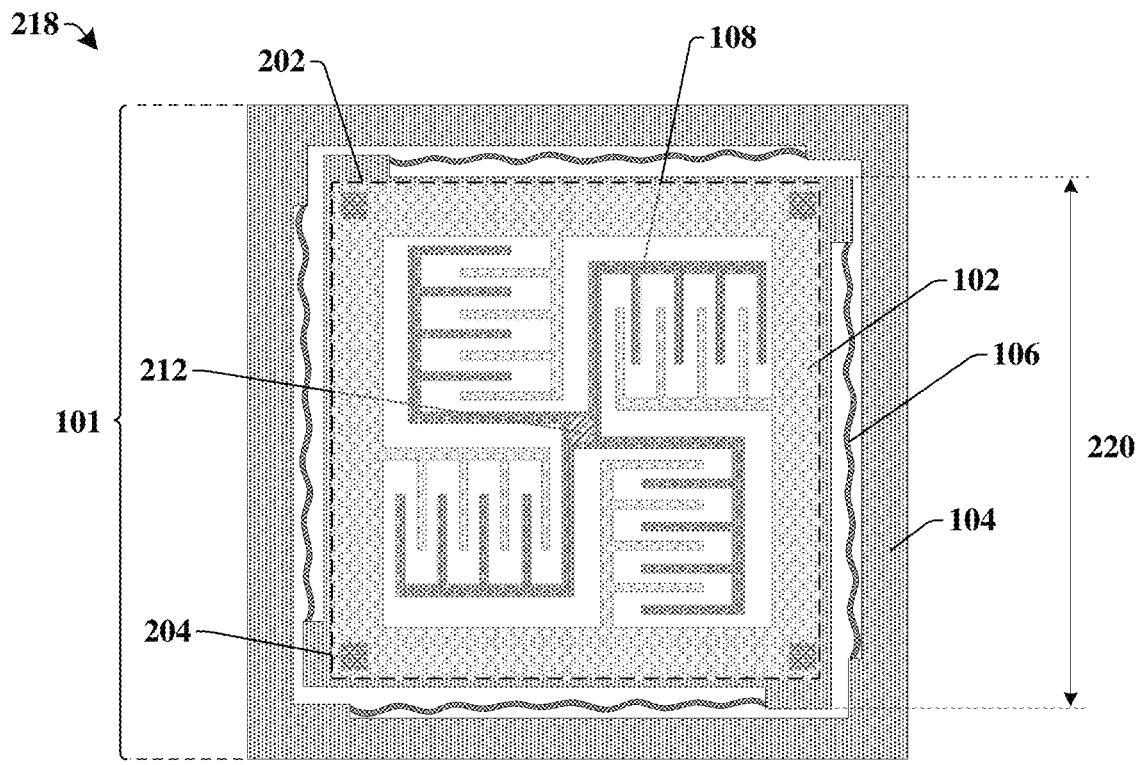

FIG. 2B illustrates some embodiments of a top-view 218 of the MEMS actuator 101 taken along cross-sectional line A-A' of FIG. 2A.

As shown in top-view 218, the proof mass 102 of the MEMS actuator 101 is coupled to the frame 104 by way of one or more curved cantilevers 106. In some embodiments, the proof mass 102 has a maximum length 220 extending between outermost edges of the proof mass 102. In some embodiments, the maximum length 220 of the proof mass 102 is in a range of between approximately 100 microns (μm) and approximately 2000 μm, between approximately 200 μm and approximately 1200 μm, or other similar values. In some embodiment, a ratio of the maximum length 220 of the proof mass 102 to a maximum length of the one or more curved cantilevers 106 is between approximately 1 and approximately 4, between approximately 1.15 and approximately 3.2, or other similar values.

During operation, unwanted movement of the package box (e.g., 206 of FIG. 2A) can cause a focal point of the optical system 214 to move, thereby causing incident radiation to strike different pixel regions within the image sensor integrated chip 202. The MEMS actuator 101 is configured to move the image sensor integrated chip 202 in response to the unwanted movements of the package box 206 to reduce the effects of movement on the image sensor integrated chip 202 (e.g., reduce blurring of an image by minimizing the movement of incident radiation between pixels) and therefore stabilize an image being captured by the image sensor integrated chip 202. For example, when a change in position of the image sensor integrated chip 202 is detected a signal is applied to the anchor 108 and/or the proof mass 102 of the MEMS actuator 101. The signal moves the proof mass 102 and the image sensor integrated chip 202 to mitigate the effects of the movement (e.g., in a direction opposite to the direction of the camera shake thereby stabilizing an image captured by the image sensor integrated chip 202).

For example, FIGS. 3A-3B illustrate some embodiments showing operation of a disclosed MEMS actuator 101 having one or more curved cantilevers.

As shown in cross-sectional view 300 and top-view 302 of FIG. 3A, at a first time the MEMS actuator 101 holds the image sensor integrated chip 202 at a first angle $\theta_1$ with respect to a line 301 that is normal to an upper surface of the base substrate 210 (i.e., that is oriented at an angle $\phi$ of 90 degrees with respect to the upper surface of the base substrate 210). The first angle $\theta_1$ is achieved by having a first distance $d_1$ between interleaved fingers within a first quadrant 304a surrounding a center of the anchor 108, a second distance $d_2$ between interleaved fingers within a second quadrant 304b surrounding the center of the anchor 108, a third distance $d_3$ between interleaved fingers within a third quadrant 304c surrounding the center of the anchor 108, and a fourth distance $d_4$ between interleaved fingers within a fourth quadrant 304d surrounding the center of the anchor 108. In some embodiments, the first angle $\theta_1$ may be approximately 90 degrees. In such embodiments, a plurality of outer edges of the proof mass 102 are at a substantially same distance over the base substrate 210.

As the package box 206 moves (e.g., due to a person's hand shaking while holding a camera), the MEMS actuator 101 is configured to move the image sensor integrated chip 202 to compensate for the movement and thereby mitigate blurriness of an image captured by the image sensor integrated chip 202. For example, as shown in cross-sectional view 306 and top-view 308 of FIG. 3B, at a second time the MEMS actuator 101 may compensate for movement of the package box 206 by moving the image sensor integrated chip 202 to be oriented at a second angle $\theta_2$ with respect to a line 307 that is normal to an upper surface of the base substrate 210. To move the image sensor integrated chip 202 to compensate for the movement, the distances between interleaved fingers within one or more of the quadrants 304a-304d changes. For example, a distance between interleaved fingers within the second quadrant 304b may change from the second distance $d_2$ to a modified second distance $d_2'$. The change in the second distance changes a height of a first edge of the proof mass 102, thereby rotating the proof mass 102 and the image sensor integrated chip 202. In some embodiments, the distance between interleaved fingers may be changed by applying an electrical signal (e.g., a voltage) to the anchor 108 and/or the proof mass 102.

Figure 4A:
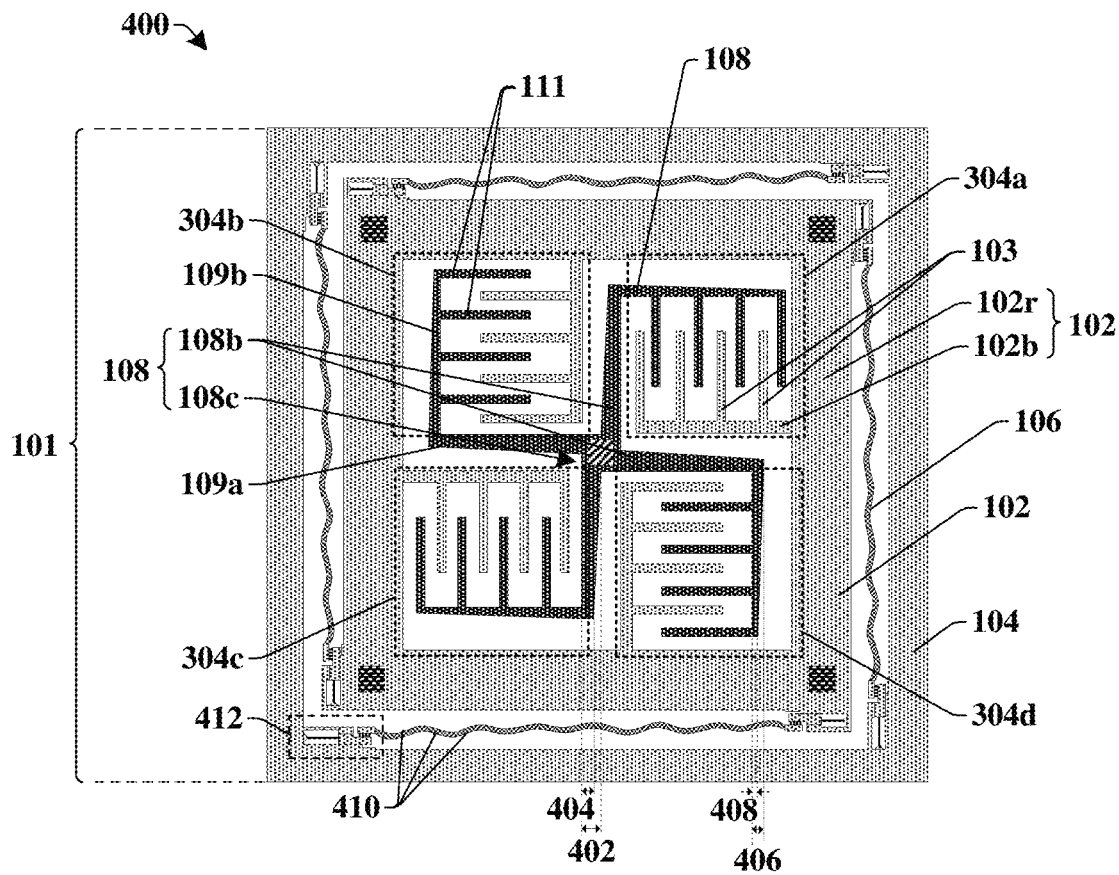
FIGS. 4A-4B illustrate some embodiments of an integrated chip structure comprising a MEMS actuator having a proof mass coupled to a frame by one or more curved cantilevers.

FIG. 4A illustrates a top-view of some additional embodiments of an integrated chip structure 400 comprising a MEMS actuator having a proof mass coupled to a frame by one or more curved cantilevers.

The integrated chip structure 400 comprises a MEMS actuator 101 having an anchor 108 surrounded by a proof mass 102. The proof mass 102 is further surrounded by a frame 104. The anchor 108 comprises a cross-shape having a first plurality of branches 108b extending outward from a central region 108c. In some embodiments, each of the first plurality of branches 108b comprises a first segment 109a extending in a first direction and a second segment 109b extending in a second direction perpendicular to the first direction. In some embodiments, each of the first plurality of branches 108b comprises a bend having a 90 degree angle. A first plurality of fingers 111 extend outward from each of the first plurality of branches 108b of the anchor 108.

In some embodiments, a width of the first segment 109a increases as a distance from the central region 108c increases. For example, the width of the first segment 109a of one of the first plurality of branches 108b may increase from a first width 402 close to the central region 108c to a second width 404 at a greater distance from the central region 108c. In some embodiments, a width of the second segment 109b also increases as a distance from the first segment 109a increases. For example, the width of the second segment 109b of one of the first plurality of branches 108b may increase from a third width 406 close to the first segment 109a to a fourth width 408 at a greater distance from the first segment 109a.

The proof mass 102 surrounds the anchor 108. In some embodiments, the proof mass 102 comprises a ring region 102r that wraps around the anchor 108 in a closed loop (e.g., an unbroken loop). A second plurality of branches 102b extend inward from interior sidewalls of the ring region 102r of the proof mass 102 that face the anchor 108. A second plurality of fingers 103 extend outward from each of the second plurality of branches 102b. The first plurality of fingers 111 are interleaved with the second plurality of fingers 103.

One or more curved cantilevers 106 couple the proof mass 102 to the frame 104. The one or more curved cantilevers 106 comprise curved outer surfaces having a plurality of inflection points 410. In some embodiments, the one or more curved cantilevers 106 comprise sidewalls having the plurality of inflection points 410, as viewed in the top-view of FIG. 4A. In some embodiments, the one or more curved cantilevers 106 extend laterally past sidewalls of one or more the second plurality of branches 102b.

In some embodiments, the proof mass 102 may have four outer edges coupled to the frame 104 by four curved cantilevers respectively disposed along one of the four outer edges of the proof mass 102. In some such embodiments, the anchor 108 may comprise four branches extending outward from a central region 108c of the anchor 108, and the proof mass 102 may comprise four branches extending inward from the ring region 102r. In some embodiments, the anchor 108 comprises a first branch extending outward from the central region 108c to the right, a second branch extending outward from the central region 108c to the left, a third branch extending outward from the central region 108c downward, and a fourth branch extending outward from the central region 108c upward, as viewed in a top-view. In some embodiments, the four branches are orientated at approximately 90 degrees from one another. In such embodiments, the first plurality of fingers 111 are interleaved with the second plurality of fingers 103 within a first quadrant 304a, a second quadrant 304b, a third quadrant 304c, and a fourth quadrant 304d surrounding the central region 108c of the anchor 108.

In some embodiments, the one or more curved cantilevers 106 extend from a surface of the proof mass 102 that faces a first direction to a surface of the frame 104 that faces an opposing second direction. In some embodiments, the one or more curved cantilevers 106 may be coupled to the proof mass 102 and to the frame 104 by way of an absorber 412. The absorber 412 is configured to dampen vibrations on the one or more curved cantilevers 106, thereby reducing a stress on the one or more curved cantilevers.

Figure 4B:
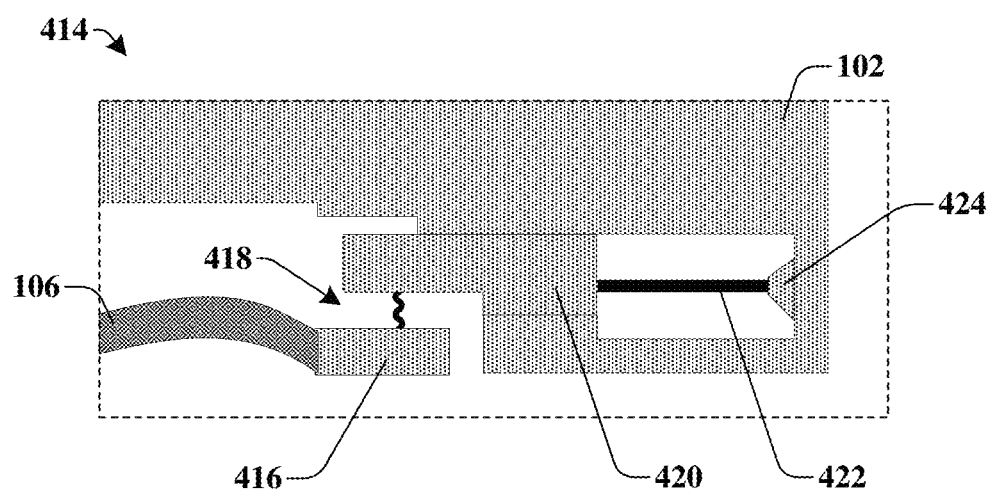

FIG. 4B illustrates a top-view 414 of some embodiments of an absorber 412 coupled to the one or more curved cantilevers 106. As shown in top-view 414, the absorber 412 may comprise a receiving element 416 that is coupled to the one or more curved cantilevers 106. The receiving element 416 is coupled to a damping element 420 by way of an elastic spring 418. During operation, the damping element 420 may move in response to stress due to an elastic line 422 coupled to a base 424. The elastic spring 418 may further move in response to the stress, thereby reducing a stress upon ends of the one or more curved cantilevers 106.

Figure 5A:
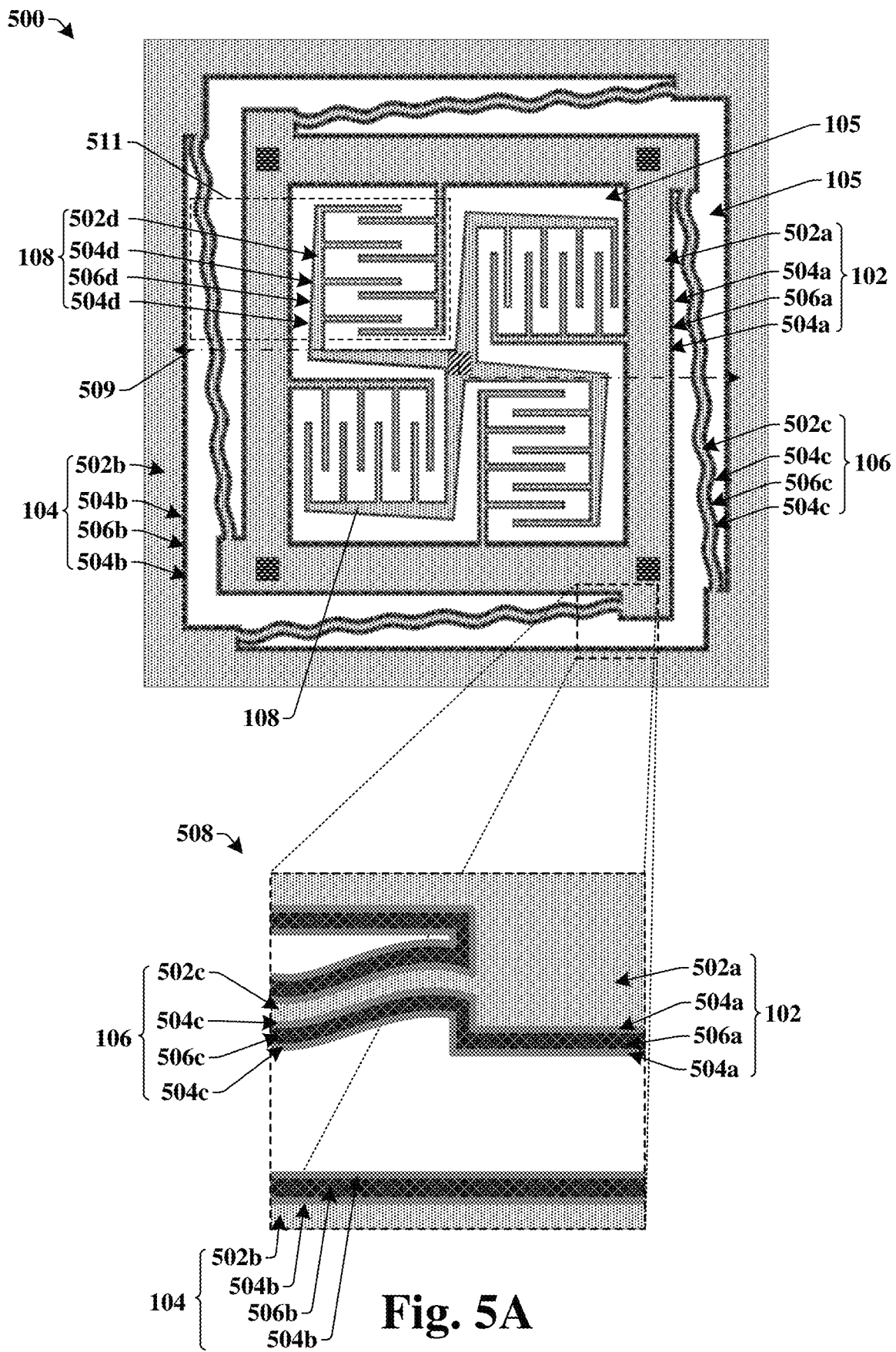
FIGS. 5A-5C illustrate some embodiments of an integrated chip structure comprising a MEMS actuator having a proof mass coupled to a frame by one or more curved cantilevers.

FIG. 5A illustrates a top-view 500 of some additional embodiments of an integrated chip structure comprising a MEMS actuator having a proof mass coupled to a frame by one or more curved cantilevers.

The MEMS actuator 101 comprises a proof mass 102 coupled to a frame 104 by way of one or more curved cantilevers 106. The proof mass 102 surrounds an anchor 108. The proof mass 102 has a first plurality of fingers and the anchor 108 comprises a second plurality of fingers that are interleaved with the first plurality of fingers.

The proof mass 102 comprises a proof mass central region 502a surrounded by proof mass exterior regions respectively comprising a proof mass core 506a and a proof mass dielectric liner 504a. The frame 104 comprises a frame central region 502b and one or more frame exterior regions respectively comprising a frame core material 506b surrounded by a frame dielectric liner 504b. The one or more curved cantilevers 106 respectively comprise a cantilever central region 502c surrounded by cantilever exterior regions respectively comprising a cantilever core material 506c surrounded by a cantilever dielectric liner 504c. The anchor 108 comprises an anchor central region 502d surrounded by anchor exterior regions respectively comprising an anchor core material 506d surrounded by an anchor dielectric liner 504d.

In some embodiments, the central regions 502a-502d may comprise a semiconductor material (e.g., silicon, polysilicon, crystallized silicon, doped silicon, or the like). In some embodiments, the dielectric liners 504a-504d may comprise an oxide (e.g., silicon dioxide), a nitride (e.g., silicon nitride, silicon oxynitride, etc.), a carbide (e.g., silicon carbide, silicon oxycarbide, etc.), or the like. In some embodiments, the core materials 506a-506d may comprise polysilicon. In some embodiments, the core materials 506a-506d may extend to an uppermost surface of the dielectric liners 504a-504d and/or the central regions 502a-502d.

In some embodiments, the semiconductor material, the core materials, and the dielectric liners may respectively have a Young's modulus of greater than approximately 100 GPa (Giga Pascals), greater than approximately 120 GPa, greater than approximately 150 GPa, or other similar values. For example, in some embodiments, the dielectric liner may have a Young's modulus of between approximately 150 GPa and approximately 200 GPa, the semiconductor material may have a Young's modulus of between approximately 150 GPa and approximately 200 GPa, and the core material may have a Young's modulus of between approximately 120 GPa and approximately 200 GPa. The relatively high Young's modulus of the semiconductor material, the core materials, and the dielectric liners improves the one or more curved cantilevers 106 ability to undergo stress, thereby further improving a reliability of the one or more curved cantilevers 106.

Top-view 508 illustrates an enlarged view of a portion of the MEMS actuator 101, further illustrating the central regions 502a-502c, the core materials 506a-506c, and the dielectric liners 504a-504c within the proof mass 102, the one or more curved cantilevers 106, and the frame 104.

Figure 5B:
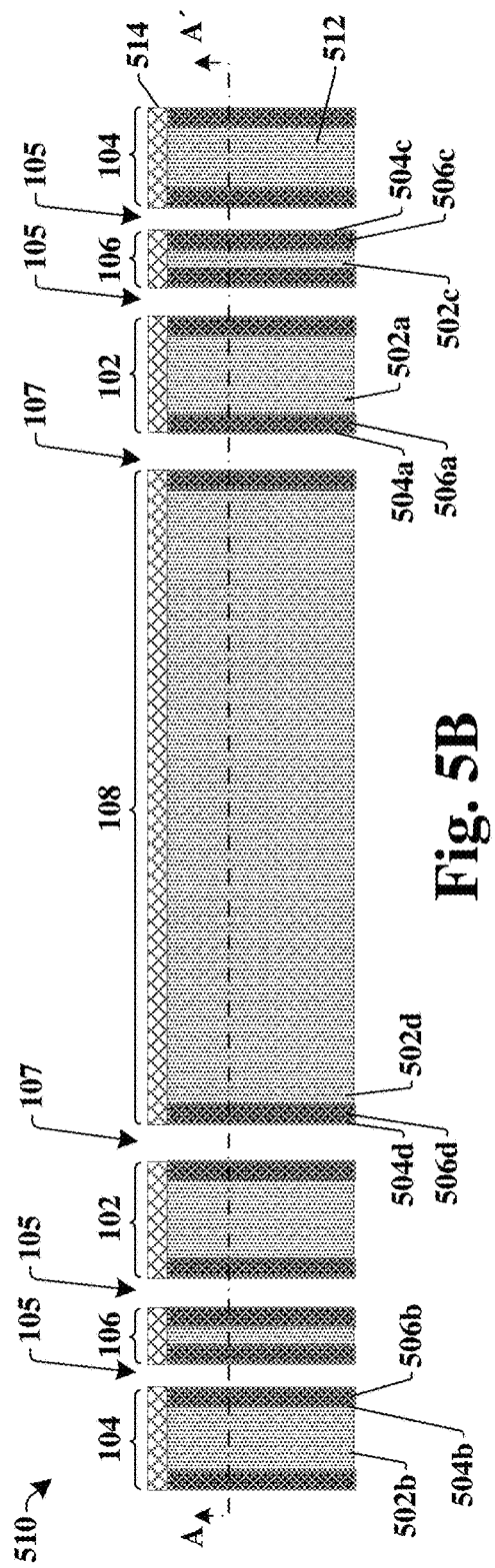

FIG. 5B illustrates a cross-sectional view 510 of the MEMS actuator 101 taken along line 509 of FIG. 5A. As shown in cross-sectional view 510, the frame 104, the proof mass 102, the one or more curved cantilevers 106, and the anchor 108 are arranged within a semiconductor layer 512 (e.g., a MEMS substrate). The dielectric liners 504a-504d completely cover sidewalls of the central regions 502a-502d and the core materials 506a-506d.

The one or more curved cantilevers 106 are separated from the frame 104 and the proof mass 102 by way of one or more first openings 105. The proof mass 102 is further separated from the anchor 108 by way of one or more second openings 107. The one or more first openings 105 and the one or more second openings 107 are respectively defined by sidewalls of the dielectric liners 504a-504d.

In some embodiments, a dielectric cap 514 may be disposed over the central regions 502a-502d, the dielectric liners 504a-504d, and the core materials 506a-506d within the frame 104, the proof mass 102, the one or more curved cantilevers 106, and the anchor 108. In some embodiments, the dielectric cap 514 may comprise an oxide (e.g., silicon dioxide), a nitride (e.g., silicon nitride, silicon oxynitride, etc.), a carbide (e.g., silicon carbide, silicon oxycarbide, etc.), or the like. In such embodiments, the semiconductor layer 512, the dielectric liners 504a-504d, and the core materials 506a-506d may continuously extend from a bottommost surface of the MEMS actuator 101 to the dielectric cap 514. In other embodiments, the dielectric cap 514 may be omitted so that the semiconductor layer 512, the dielectric liners 504a-504d, and the core materials 506a-506d continuously extend from a bottommost surface of the MEMS actuator 101 to a topmost surface of the MEMS actuator 101.

Figure 5C:
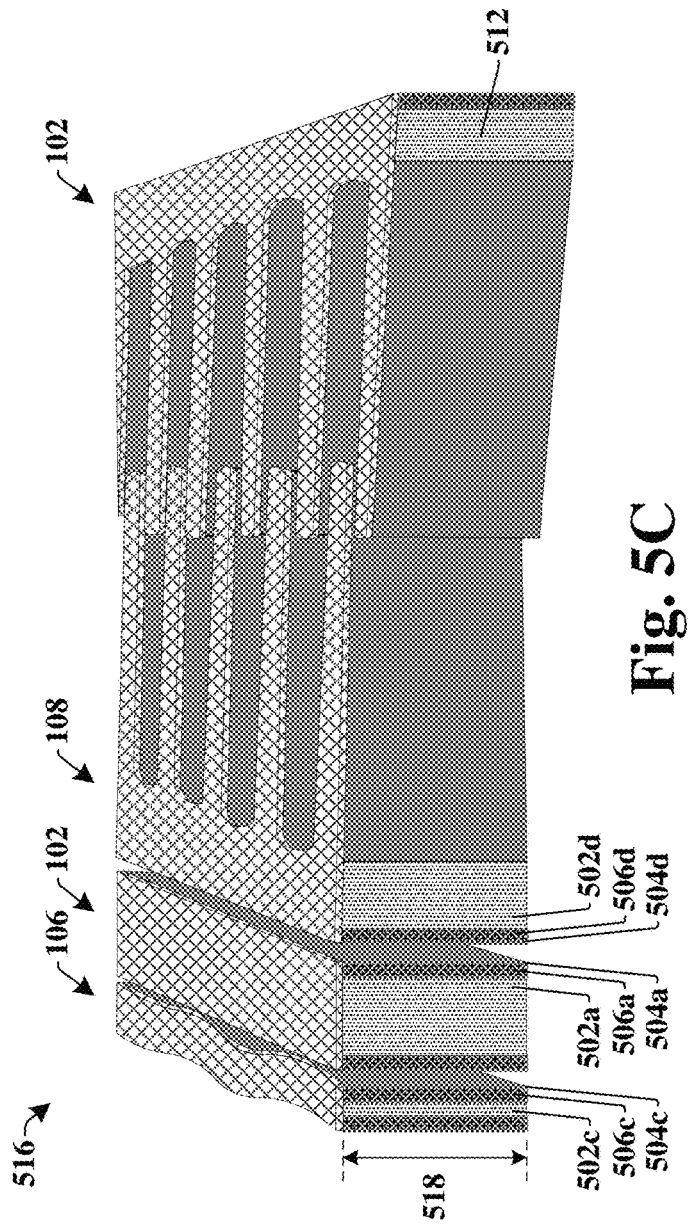

FIG. 5C illustrates a three-dimensional view 516 of a portion 511 of the MEMS actuator 101 shown in FIG. 5A. As shown in three-dimensional view 516, the one or more curved cantilevers 106 may have a thickness 518 that is approximately equal to a thickness of the proof mass 104.

FIG. 6 illustrates a top-view showing some embodiments of a curved cantilever 600.

The curved cantilever 600 comprises a wavy profile having opposing sides comprising curved segments. In some embodiments, the curved segments are separated by substantially straight regions. In other embodiments, the curved segments meet at a plurality of inflection points arranged along opposing sides of the curved cantilever. The curved cantilever 600 has a length 602 that is in a range of between approximately 200 microns (μm) and approximately 4000 μm, between approximately 230 μm and approximately 3840 μm, or other similar values. In some embodiments, the curved cantilever 600 may have a wavelength 604 (e.g., a length between peaks (maximum turning points) and/or troughs (minimum turning points) of the curved cantilever 600) that is in a range of between approximately 100 μm and approximately 500 μm, between approximately 200 μm and approximately 400 μm, or other similar values. In some embodiments, the curved cantilever 600 may have a wave height 606 (e.g., a height between a peak and a neighboring trough of the curved cantilever 600) that is in a range of between approximately 5 μm and approximately 150 μm, between approximately 10 μm and approximately 110 μm, or other similar values.

Due to the curvature of the curved cantilever 600, different locations on the curved cantilever 600 undergo different amounts of stress during movement. For example, in some embodiments, the curvature of the curved cantilever 600 may cause a first stress 608 along an outer edge of the curved cantilever that is near an inflection point, which is larger than a second stress 610 along an outer edge of the curved cantilever that is near a local maximum turning point and/or minimum turning point of the curved cantilever 600. In some embodiments, the curvature of the curved cantilever 600 may cause a third stress 612 in a central region of the curved cantilever 600 that is greater than the second stress 610. In some embodiments, the second stress 610 or the third stress 612 may be a maximum stress on the curved cantilever 600 that is less than approximately $2\times10^4$ mega Pascals (MPa), less than approximately $1.8\times10^4$ MPa, approximately $1.743\times10^4$ MPa, or other similar values, such as approximately $1.158\times10^3$ MPa, in a drop test with 250 grams in weight and 1.5 meters in height. Because the maximum stress on the curved cantilever 600 is less than that of a straight cantilever (e.g., less than approximately $1\times10^6$ MPa), the curved cantilever 600 is less likely to break during high stress (e.g., being dropped) on the curved cantilever 600 thereby improving a reliability of a disclosed MEMS actuator.

FIG. 7 illustrates some additional embodiments of an integrated chip structure 700 comprising a MEMS actuator having a proof mass coupled to a frame by one or more curved cantilevers.

The integrated chip structure 700 comprises a package box 206 (e.g., a camera module) disposed over a base substrate 210. An optical system 214 is arranged along an upper surface of the package box 206. In some embodiments, the optical system 214 may comprise an objective lens 214a and a floating lens 214b disposed between the objective lens 214a and the image sensor integrated chip 202. A MEMS actuator 101 is disposed within the package box 206 below the optical system 214. The MEMS actuator 101 comprises a frame 104 coupled to sidewalls of the package box 206. In some embodiments, a dielectric liner 504 arranged along an outermost sidewall of the MEMS actuator 101 may be coupled to a sidewall of the package box 206 (e.g., by an adhesive material). In other embodiments (not shown), a semiconductor material arranged along an outermost sidewall of the MEMS actuator 101 may be coupled to a sidewall of the package box 206.

An image sensor integrated chip 202 is disposed on the MEMS actuator 101 and between the MEMS actuator 101 and the optical system 214. The image sensor integrated chip 202 comprises an image sensing element 710 disposed within the substrate 702. In some embodiment, the image sensing element 710 may comprise a photodiode including a first region having a first doping type (e.g., n-type doping) and an adjoining second region having a second doping type (e.g., p-type doping) that is different than the first doping type. A transistor gate structure 704 is arranged along a first-side of the substrate 702. In some embodiments, the transistor gate structure 704 may correspond to a transfer transistor. In such embodiments, the transistor gate structure 704 is laterally arranged between the image sensing element 710 and a floating diffusion well 712. The transistor gate structure 704 is configured to control the transfer of charge from the image sensing element 710 (e.g., a photodiode) to the floating diffusion well 712.

A dielectric structure 706 is disposed along the first-side of the substrate 702. The dielectric structure 706 comprises a plurality of stacked inter-level dielectric (ILD) layers. In some embodiments, a plurality of conductive interconnects 708 (e.g., conductive contacts, interconnect wires, and/or interconnect vias) are disposed within the dielectric structure 706.

A dielectric planarization structure 714 may be arranged along a second side of the substrate 702. The dielectric planarization structure 714 has a substantially planar surface facing away from the substrate 702. In various embodiments, the dielectric planarization structure 714 may comprise one or more stacked dielectric layers (e.g., an oxide, a nitride, or the like). A grid structure 716 is disposed on the dielectric planarization structure 714. In various embodiments, the grid structure 716 may comprise a metal (e.g., aluminum, cobalt, copper, silver, gold, tungsten, etc.) and/or a dielectric material (e.g., $SiO_2$, SiN, etc.). A color filter 718 is arranged within an opening in the grid structure 716. The color filter 718 is configured to selectively transmit specific wavelengths of incident radiation. For example, the color filter 718 may transmit radiation having wavelengths within a first range (e.g., corresponding to green light), while a second color filter (not shown) may transmit radiation having wavelengths within a second range (e.g., corresponding to red light) different than the first range, etc. A micro-lens 720 is arranged over the color filter 718. The micro-lens 720 is laterally aligned with the color filter 718 and is configured to focus the incident radiation (e.g., light) towards the image sensing element 710.

In some embodiments, a MEMS gyroscope 722 and/or a MEMS accelerometer 724 may be disposed on the base substrate 210. The MEMS gyroscope 722 and/or the MEMS accelerometer 724 are configured to detect and/or measure movement of the package box 206. In some embodiments, the MEMS gyroscope 722 and/or the MEMS accelerometer 724 may be coupled to a control circuitry 726 disposed on the base substrate 210. The control circuitry 726 is configured to send a signal to the MEMS actuator 101 based on a detected movement sensed by the MEMS gyroscope 722 and/or the MEMS accelerometer 724. The signal is configured to cause the MEMS actuator 101 to move in a manner that mitigates an effect of the movement of the package box 206 on the image sensor integrated chip 202, so as to mitigate blurriness in images captured by the image sensor integrated chip 202.

FIGS. 8-17 illustrate cross-sectional views 800-1700 showing some embodiments of a method of forming an integrated chip structure comprising a MEMS actuator having a proof mass coupled to a frame by one or more curved cantilevers. Although FIGS. 8-17 are described in relation to a method, it will be appreciated that the structures disclosed in FIGS. 8-17 are not limited to such a method, but instead may stand alone as structures independent of the method.

Figure 8:
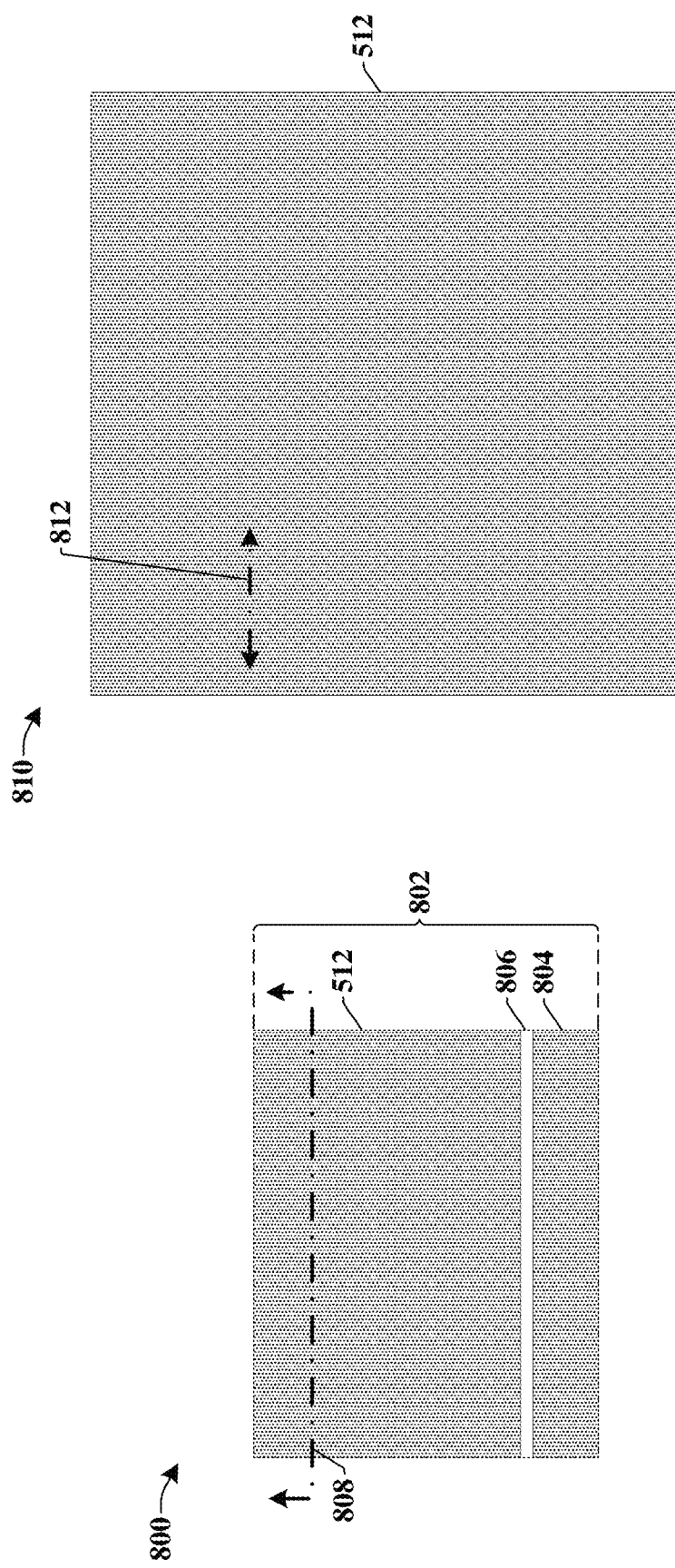

As shown in cross-sectional view 800 (taken along line 812) and top-view 810 (taken along line 808) of FIG. 8, a substrate 802 is provided. The substrate 802 comprises a lower semiconductor layer 804 separated from a semiconductor layer 512 by an insulating layer 806. In some embodiments, the lower semiconductor layer 804 and the semiconductor layer 512 may comprise silicon, germanium, gallium, or the like. In some embodiments, the insulating layer 806 may comprise an oxide (e.g., silicon oxide), a nitride (e.g., silicon oxynitride), or the like.

In some embodiments, the lower semiconductor layer 804 may be a first substrate comprising a first semiconductor body, a handle wafer, or the like. In some embodiments, the semiconductor layer 512 may be a second semiconductor body, a MEMS wafer, or the like. In some embodiments, the substrate 802 may be provided by forming the insulating layer 806 over the lower semiconductor layer 804 and subsequently bonding the semiconductor layer 512 to the insulating layer 806. In some embodiments, the insulating layer 806 may be formed by a thermal oxidation process, such as a wet thermal oxidation process or a dry thermal oxidation process. During such embodiments, the lower semiconductor layer 804 is placed in a furnace and heated to a temperature typically ranging between approximately 800 degrees Celsius (° C.) and approximately 1200° C. in the presence of oxygen to form the insulating layer 806. In other embodiments, the insulating layer 806 can be formed by a spin-on process, a plasma vapor deposition (PVD) process, a chemical vapor deposition (CVD) process, an atomic layer deposition (ALD) process, or other techniques. In some embodiments, the semiconductor layer 512 is bonded to a top surface of the insulating layer 806 through a fusion bonding process.

Figure 9:
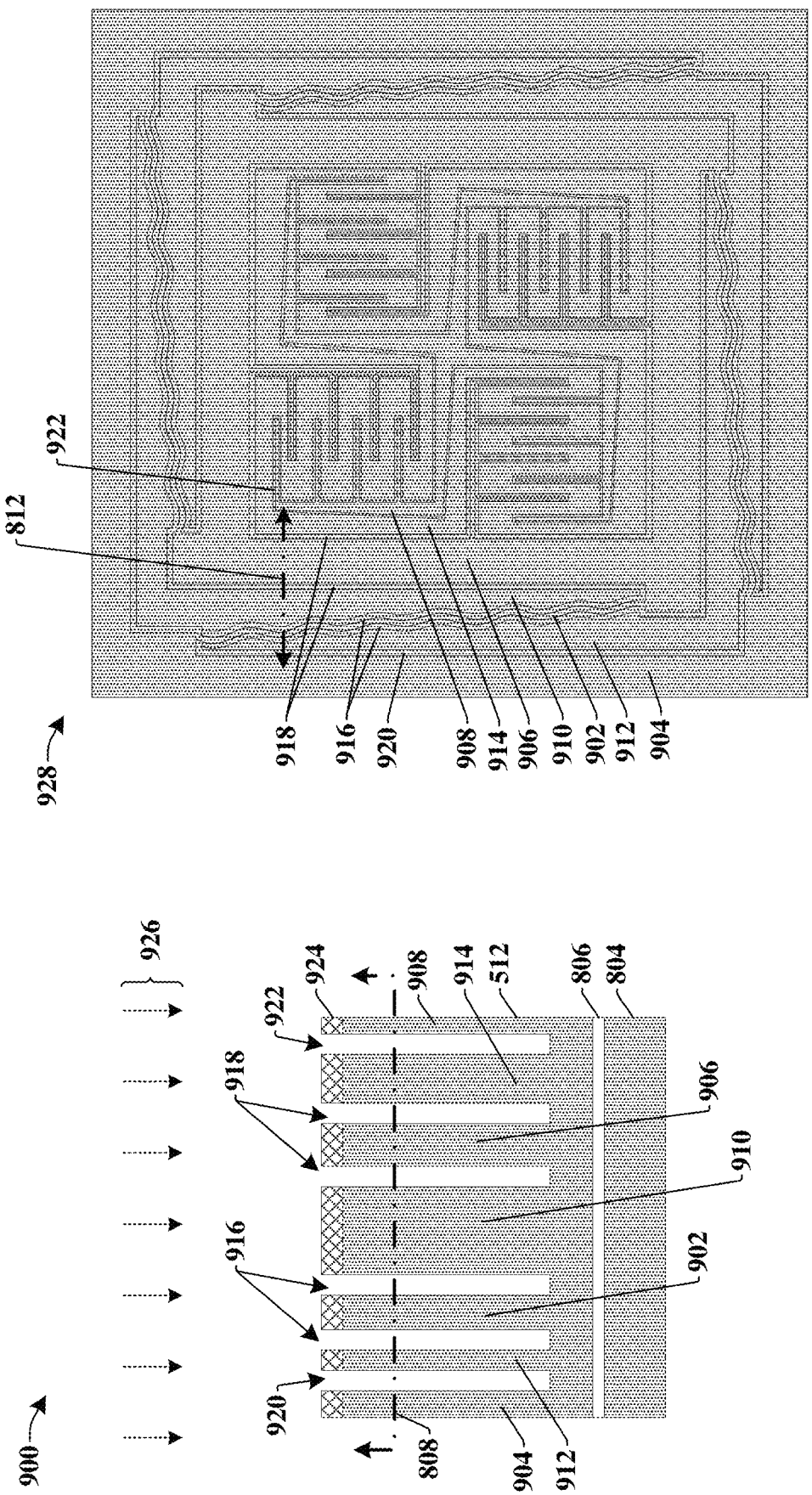

As shown in cross-sectional view 900 (taken along line 812) and top-view 928 (taken along line 808) of FIG. 9, the semiconductor layer 512 is patterned to form a plurality of trenches that extend into the semiconductor layer 512 to define a cantilever region 902, a frame region 904, a proof mass region 906, and an anchor region 908. The cantilever region 902, the frame region 904, the proof mass region 906, and the anchor region 908 are separated from one another by the plurality of trenches. In some embodiments, the cantilever region 902, the frame region 904, the proof mass region 906, and the anchor region 908 may also be separated from one another by sacrificial regions 910-914. The cantilever region 902 is defined by curved sidewalls of the semiconductor layer 512 that continuously extend between the frame region 904 and the proof mass region 906.

In some embodiments, the plurality of trenches comprise a plurality of curved trenches 916 on opposing sides of the cantilever region 902, a first plurality of straight trenches 918 on opposing sides of the proof mass region 906, a second straight trench 920 between the frame region 904 and the plurality of curved trenches 916, and a third straight trench 922 between the anchor region 908 and the first plurality of straight trenches 918. The plurality of curved trenches 916 are separated from the first plurality of straight trenches 918 by a first sacrificial region 910 and from the second straight trench 920 by a second sacrificial region 912. The first plurality of straight trenches 918 are separated from the third straight trench 922 by a third sacrificial region 914. In some embodiments, the plurality of curved trenches 916, the first plurality of straight trenches 918, the second straight trench 920, and the third straight trench 922 have bottoms defined by horizontally extending surfaces of the semiconductor layer 512.

In some embodiments, the plurality of curved trenches 916, the first plurality of straight trenches 918, the second straight trench 920, and the third straight trench 922 are respectively defined by sidewalls and a horizontally extending surface of the semiconductor layer 512. In some embodiments, the plurality of curved trenches 916, the first plurality of straight trenches 918, the second straight trench 920, and the third straight trench 922 are formed by a lithography process that forms a patterned masking layer 924 over the semiconductor layer 512 and that subsequently etches exposed areas of the semiconductor layer 512 with an etchant 926. In some embodiments, the etchant 926 may comprise a dry etchant. In some embodiments, the dry etchant may comprise a fluorine based etching chemistry. For example, the dry etchant may have an etching chemistry comprising carbon tetrafluoride ($CF_4$), trifluoromethane ($CHF_3$), octafluorocyclobutane ($C_4F_8$), or the like. In other embodiments, the dry etchant may comprise an etching chemistry comprising chlorine ($Cl_2$), $HB_4$, Argon (Ar), or the like.

Figure 10:
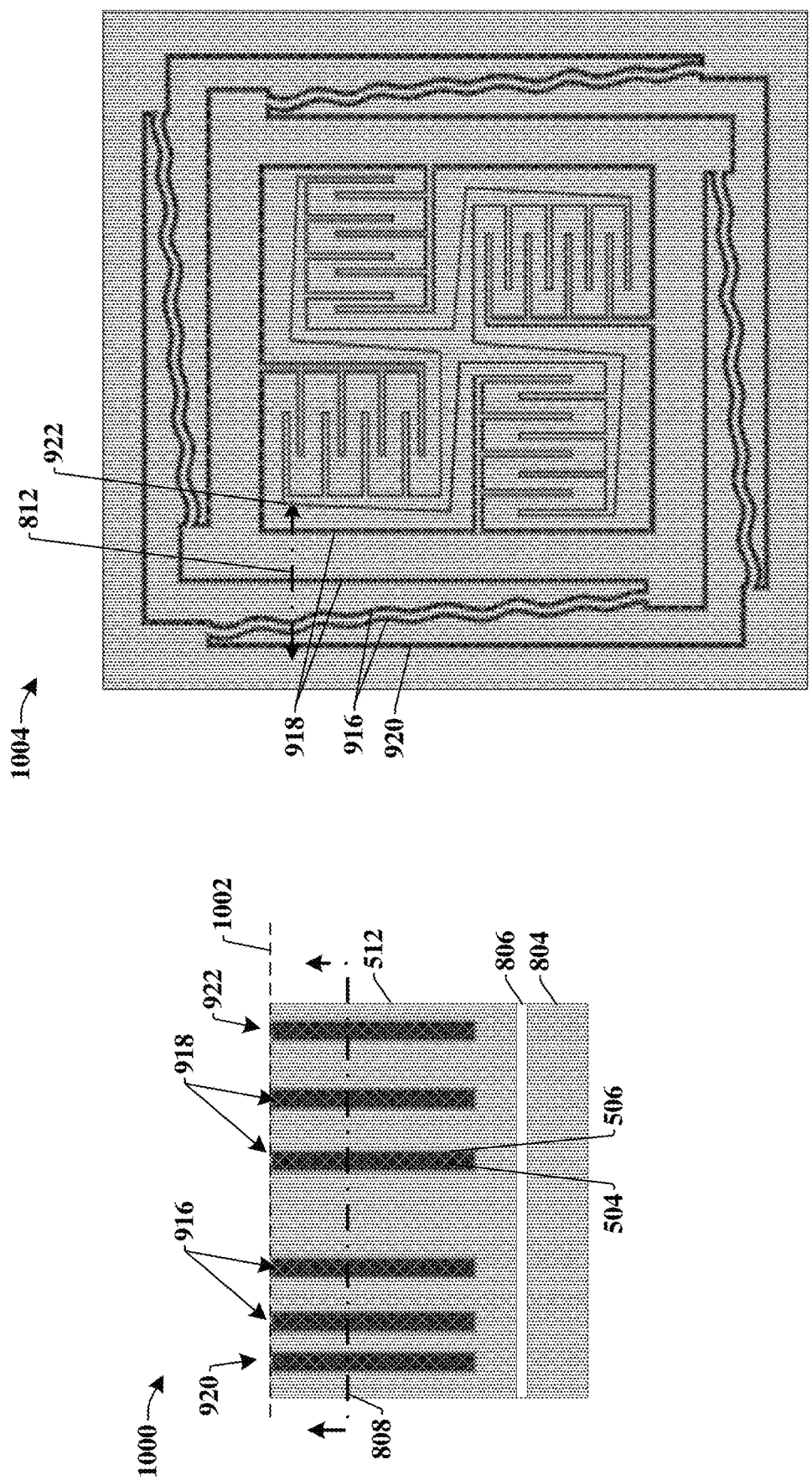

As shown in cross-sectional view 1000 (taken along line 812) and top-view 1004 (taken along line 808) of FIG. 10, one or more fill materials are formed within the plurality of trenches (e.g., the plurality of curved trenches 916, the first plurality of straight trenches 918, the second straight trench 920, and the third straight trench 922). The one or more fill materials completely fill the plurality of trenches. In some embodiments, the one or more fill materials may comprise a dielectric liner 504 formed along interior surfaces of the plurality of trenches and a core material 506 arranged on the dielectric liner 504. In some embodiments, the dielectric liner 504 may comprise an oxide (e.g., silicon oxide), a nitride (e.g., silicon nitride), or the like. In some embodiments, the core material 506 may comprise polysilicon or the like. In some embodiments, the one or more fill materials may comprise a Young's modulus that is greater than or equal to approximately 120 GPa.

In some embodiments, the dielectric liner 504 may be formed by a thermal oxidation process. In such embodiments, the semiconductor layer 512 may be exposed to a high temperature (e.g., greater than or equal to approximately 700° C., greater than or equal to approximately 800° C., between approximately 900° C. and approximately 1100° C., or other similar values). In some embodiments, the semiconductor layer 512 may be exposed to the high temperature in a presence of water vapor. The thermal oxidation process forms an oxide along interior surfaces of the plurality of trenches. The core material 506 is subsequently formed by way of a deposition process onto the dielectric liner 504 and within the plurality of trenches. In various embodiments, the deposition process may comprise a PVD process, a CVD process, a PE-CVD process, an ALD process, or the like. In some embodiments, a planarization process (e.g., a chemical mechanical planarization (CMP) process) may be performed along line 1002 to remove excess of the semiconductor material from over a top of the semiconductor layer 512.

As shown in cross-sectional view 1100 (taken along line 812) and top-view 1102 (taken along line 808) of FIG. 11, a dielectric cap 514 is formed over the semiconductor layer 512. The dielectric cap 514 covers the cantilever region 902, the frame region 904, the proof mass region 906, and the anchor region 908. The dielectric cap 514 exposes the first sacrificial region 910, the second sacrificial region 912, and the third sacrificial region 914. In various embodiments, the dielectric cap 514 comprises an oxide (e.g., silicon oxide), a nitride (e.g., silicon nitride, silicon oxynitride, etc.), a carbide (e.g., silicon carbide, silicon oxycarbide, etc.), or the like.

As shown in cross-sectional view 1200 (taken along line 812) and top-view 1206 (taken along line 808) of FIG. 12, a release etching process is performed by exposing the semiconductor layer 512 to an etchant 1202 with the dielectric cap 514 in place over the semiconductor layer 512. The release etching process removes the first sacrificial region (e.g., 910 of FIG. 11) and the second sacrificial region (e.g., 912 of FIG. 11) to form one or more first openings 105 separating one or more curved cantilevers 106 from a frame 104 and a proof mass 102 by non-zero spaces. The release etching process also removes the third sacrificial region (e.g., 914 of FIG. 11) to form one or more second openings 107 separating the proof mass 104 from an anchor 108. The release etching process also etches the semiconductor layer 512 below the one or more first openings 105 and/or the one or more second openings 107 to form a lower recess 1204 that extends below parts of the one or more curved cantilevers 106, the frame 104, the proof mass 102, and the anchor 108. In some embodiments, a lower recess 1204 is arranged within the semiconductor layer 512 and extends below parts of the frame 104, the proof mass 102, the one or more curved cantilevers 106, and the anchor 108. The lower recess 1204 is in communication with the one or more first openings 105 and the one or more second openings 107.

In some embodiments, the etchant 1202 is a wet etchant that has a high etching selectivity between the semiconductor layer 512 and the dielectric liner 504. The high etching selectivity causes the etchant 1202 to etch the semiconductor layer 512 at a first etching rate while etching the dielectric liner 504 at a second etching rate less than the first etching rate. In some embodiments, the etchant 1202 may comprise hydro-fluoric acid (HF) (e.g., an aqueous HF etch or a vapor HF etch). In other embodiments, the etchant 1202 may comprise hydrogen peroxide ($H_2O_2$), potassium hydroxide (KOH), or the like As shown in cross-sectional view 1300 (taken along line 812) and top-view 1302 (taken along line 808) of FIG. 13, the lower semiconductor layer and the insulating layer are removed from the semiconductor layer 512 to form a MEMS actuator 101. In some additional embodiments (not shown), the dielectric cap 514 may be removed from the semiconductor layer 512. In some embodiments, the lower semiconductor layer, the insulating layer, and/or the dielectric cap 514 may be removed by way of an etching process, a grinding process, a polishing process (e.g., a chemical mechanical planarization (CMP) process) or the like. In some embodiments, the lower semiconductor layer, the insulating layer, and/or the dielectric cap 514 may be removed after attaching an image sensor integrated chip (e.g., shown in cross-sectional view 1400).

Figure 14:
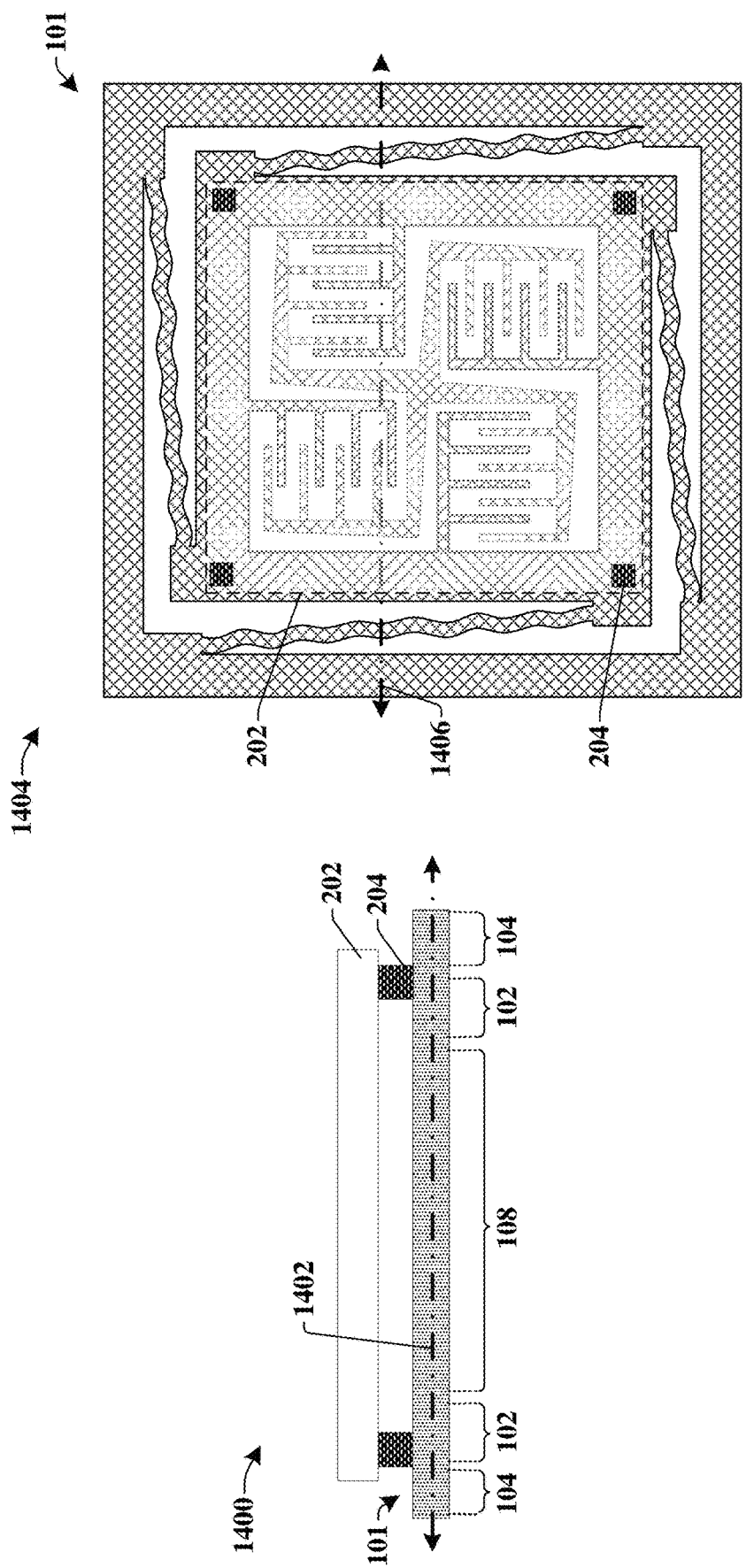

As shown in cross-sectional view 1400 (taken along line 1406) and top-view 1404 (taken along line 1402) of FIG. 14, an image sensor integrated chip 202 is placed on the MEMS actuator 101. In some embodiments, the image sensor integrated chip 202 is coupled to the proof mass 102 of the MEMS actuator 101 by way of one or more first coupling elements 204. In some embodiments, the one or more first coupling elements 204 may comprise conductive structures (e.g., solder bumps, vertical wire bonds, a wire stud, or the like) and/or a polymer. In some embodiments, the one or more first coupling elements 204 may be formed in direct contact with the semiconductor layer (e.g., 512 of FIG. 13).

Figure 15:
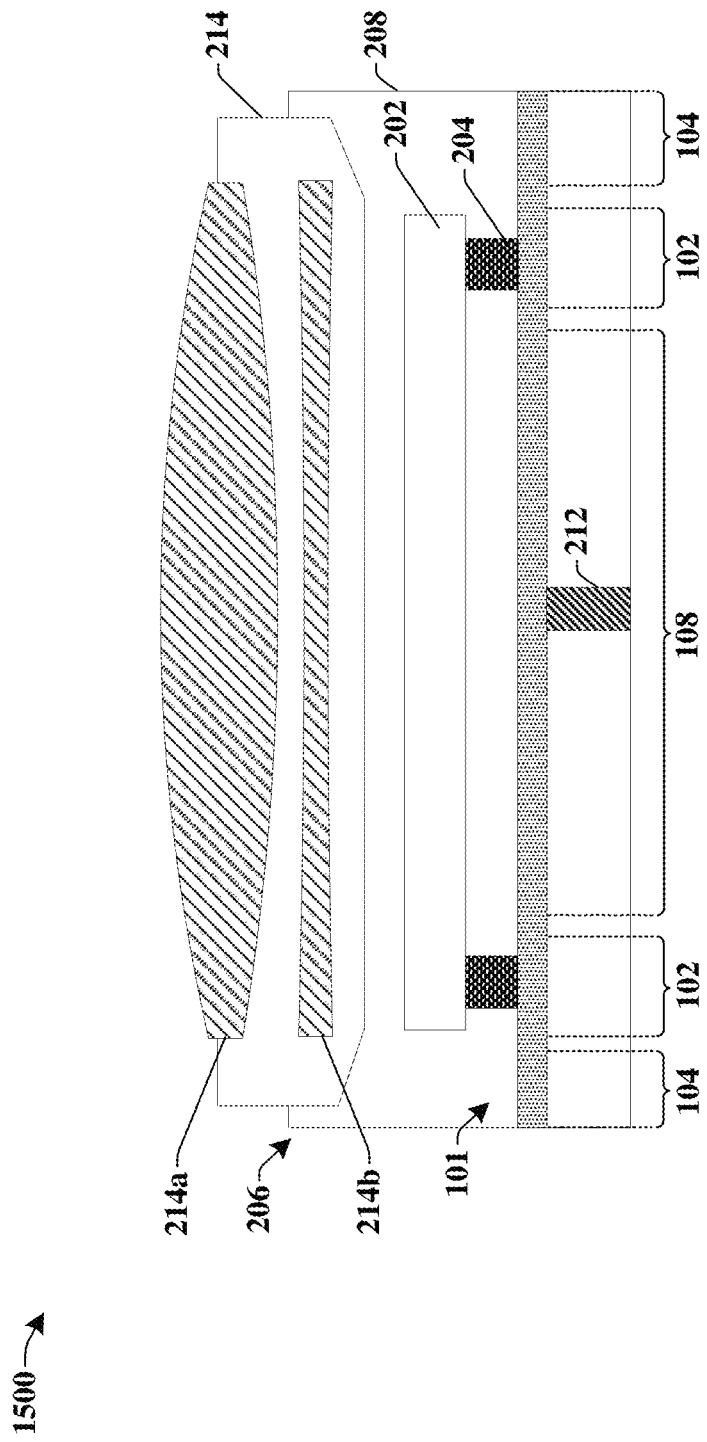

As shown in cross-sectional view 1500 of FIG. 15, the MEMS actuator 101 and image sensor integrated chip 202 are placed within a package box 206 (e.g., a camera module). The package box 206 comprises a housing 208 having sidewalls and an upper surface that surrounds the MEMS actuator 101 and the image sensor integrated chip 202. In some embodiments, the frame 104 of the MEMS actuator 101 is physically coupled to sidewalls of the package box 206.

In some embodiments, an optical system 214 is disposed along a top of the package box 206 at a location directly over the image sensor integrated chip 202. The optical system 214 may comprise one or more lenses 214a-214b that are configured to focus incident radiation onto the image sensor integrated chip 202. In some embodiments (not shown), the MEMS actuator 101 and the image sensor integrated chip 202 may be placed within the package box after the MEMS actuator 101 is coupled to a base substrate.

Figure 16:
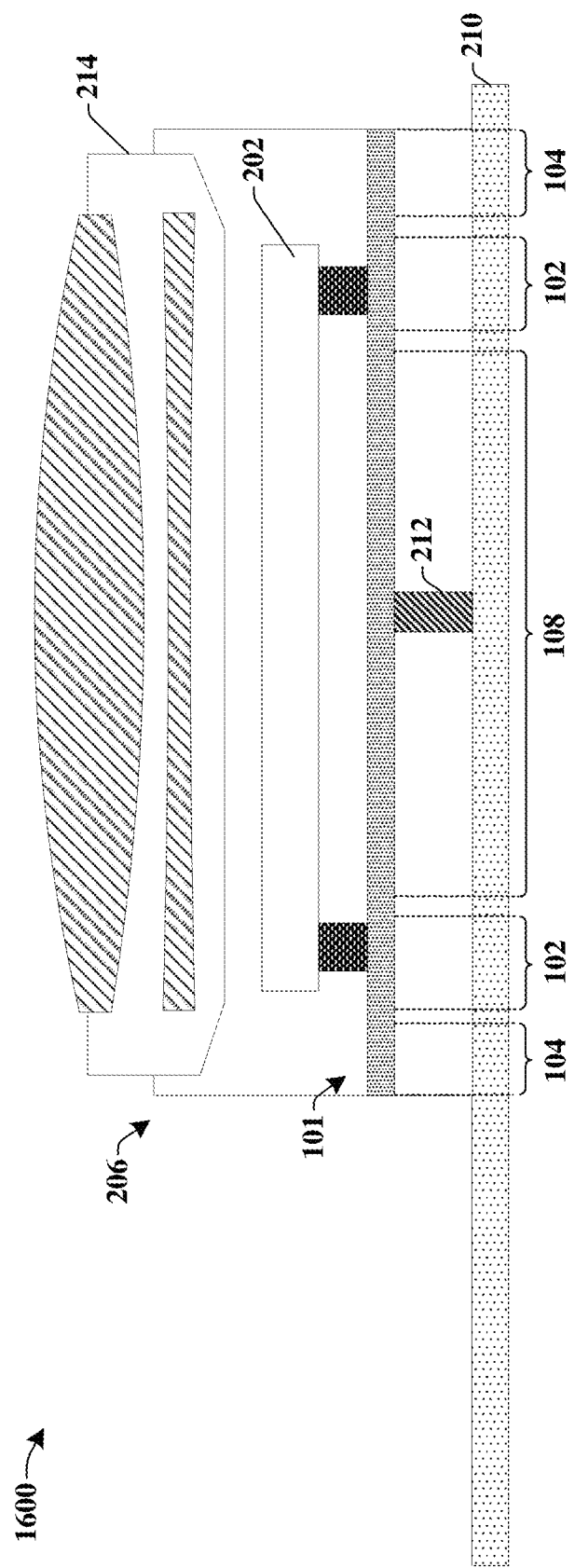

As shown in cross-sectional view 1600 of FIG. 16, the package box 206 and/or the MEMS actuator 101 are coupled to a base substrate 210. In some embodiment, the base substrate 210 may comprise a printed circuit board (PCB). In some embodiments, the MEMS actuator 101 may be coupled to the base substrate 210 prior to forming the package box 206 over the MEMS actuator 101. In some embodiments, the MEMS actuator 101 may be coupled to the base substrate 210 by way of one or more second coupling elements 212. In some embodiments, the one or more second coupling elements 212 may comprise conductive structures (e.g., solder bumps, vertical wire bonds, a wire stud, or the like) and/or a polymer. In some embodiments, the anchor 108 of the MEMS actuator 101 may be rigidly coupled to the base substrate 210 by way of one or more second coupling elements 212.

Figure 17:
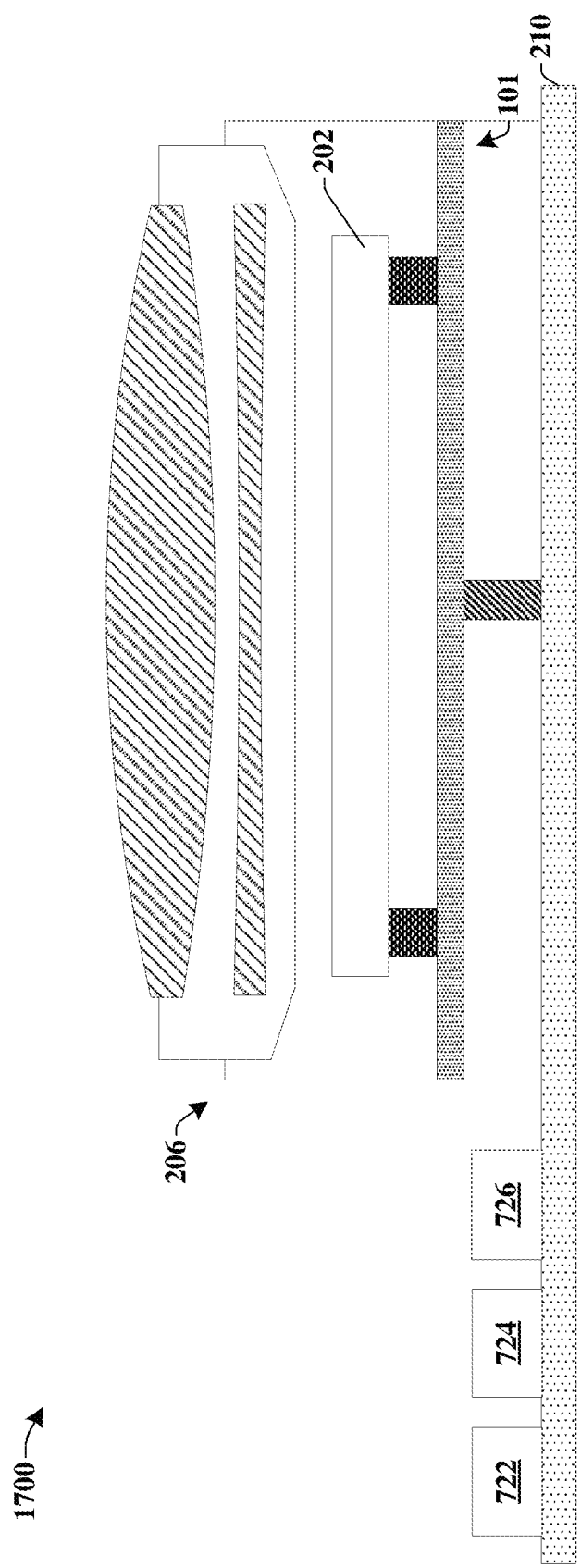

As shown in cross-sectional view 1700 of FIG. 17, one or more additional integrated chip elements 722-726 are coupled to the base substrate 210. In some embodiments, the one or more additional integrated chip elements 722-726 may comprise a MEMS gyroscope 722 and/or a MEMS accelerometer 724. The MEMS gyroscope 722 and/or the MEMS accelerometer 724 are configured to sense movement of the package box 206 (e.g., during a shaking hand). In some embodiments, the one or more additional integrated chip elements 722-726 may further and/or alternatively comprise a control circuitry 726 (e.g., a processor) configured to generate one or more signals to control operation of the MEMS actuator 101 in response to movement of the package box 206. In various embodiments, the one or more additional integrated chip elements 722-726 may be coupled to the base substrate 210 by way of a bonding process, which forms one or more conductive bumps (e.g., solder bumps) between the one or more additional integrated chip elements 722-726 and the base substrate 210.

Figure 18:
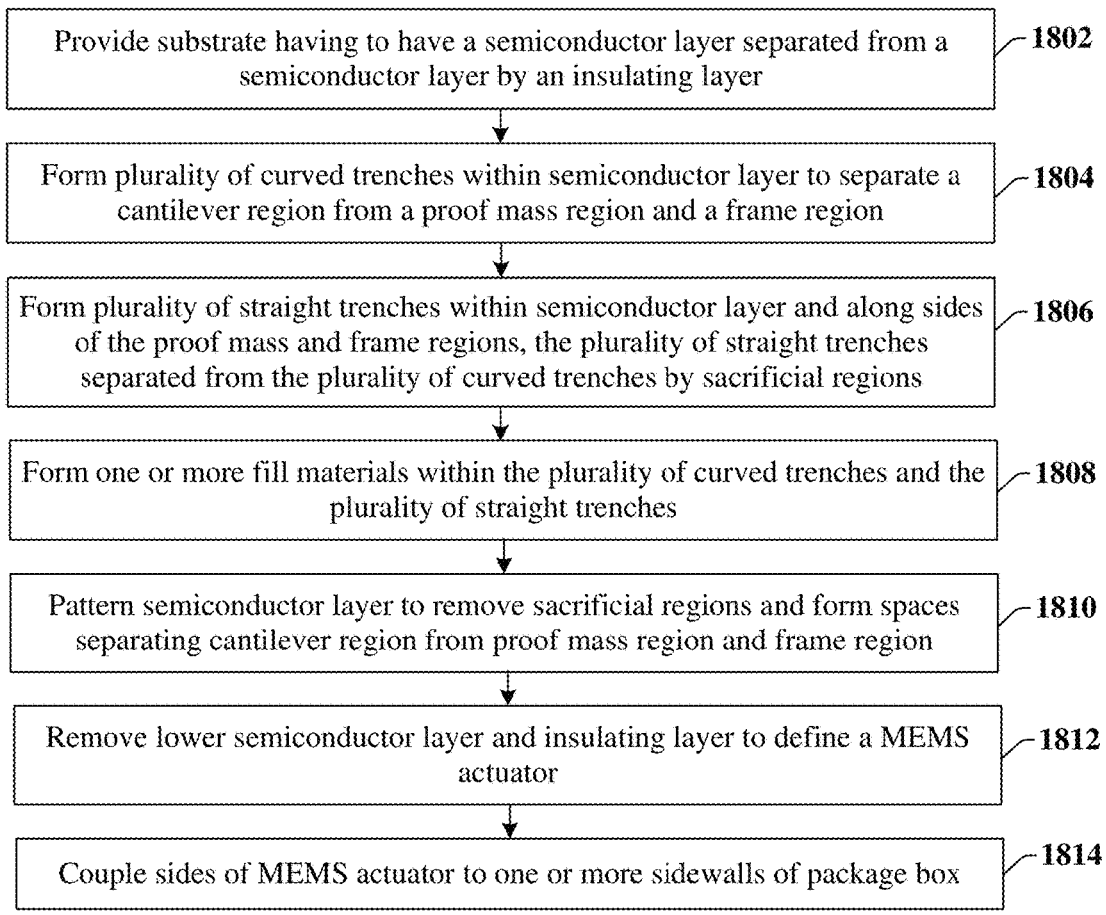
FIG. 18 illustrates a flow diagram of some embodiments of a method of forming an integrated chip structure comprising a MEMS actuator having a proof mass coupled to a frame by one or more curved cantilevers.

FIG. 18 illustrates a flow diagram of some embodiments of a method 1800 of forming an integrated chip structure comprising a MEMS actuator having a proof mass coupled to a frame by one or more curved cantilevers.

While method 1800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1802, a substrate is provided having a semiconductor layer separated from a lower semiconductor layer by an insulating layer. FIG. 8 illustrated a cross-sectional view 800 and a top-view 810 of some embodiments corresponding to act 1802.

At act 1804, a plurality of curved trenches are formed within the semiconductor layer to separate a cantilever region from a proof mass region and a frame region. FIG. 9 illustrates a cross-sectional view 900 and a top-view 928 of some embodiments corresponding to act 1804.

At act 1806, a plurality of straight trenches are formed within the semiconductor layer and along sides of the proof mass region and the frame region. The plurality of straight trenches are separated from the plurality of curved trenches by sacrificial regions. FIG. 9 illustrates a cross-sectional view 900 and a top-view 928 of some embodiments corresponding to act 1806.

At act 1808, one or more fill materials are formed within the plurality of curved trenches and the plurality of straight trenches. FIG. 11 illustrates a cross-sectional view 1000 and a top-view 1004 of some embodiments corresponding to act 1808.

At act 1810, the semiconductor layer is patterned to remove the one or more sacrificial regions and to form non-zero spaces separating a cantilever from a proof mass and a frame. FIGS. 11-12 illustrate cross-sectional views, 1100 and 1200, and top-views, 1102 and 1206, of some embodiments corresponding to act 1810.

At act 1812, the lower semiconductor layer and the insulating layer are removed to define a MEMS actuator. FIG. 13 illustrates a cross-sectional view 1300 and a top-view 1302 of some embodiments corresponding to act 1812.

At act 1814, sides of the MEMS actuator are coupled to one or more sidewalls of a package box. FIG. 15 illustrates a cross-sectional view 1500 of some embodiments corresponding to act 1814.

Accordingly, in some embodiments the present disclosure relates to an integrated chip structure comprising a MEMS (microelectromechanical systems) actuator having a proof mass coupled to a frame by one or more curved cantilevers.

In some embodiments, the present disclosure relates to an integrated chip structure. The integrated chip structure includes a MEMS (microelectromechanical systems) actuator, including an anchor having a first plurality of branches extending outward from a central region of the anchor, the first plurality of branches respectively including a first plurality of fingers; a proof mass surrounding the anchor and having a second plurality of branches extending inward from an interior sidewall of the proof mass, the second plurality of branches respectively including a second plurality of fingers interleaved with the first plurality of fingers as viewed in a top-view; one or more curved cantilevers coupled between the proof mass and a frame, the frame wrapping around the proof mass; and the one or more curved cantilevers including curved outer surfaces having one or more inflection points as viewed in the top-view. In some embodiments, the anchor includes a cross-shape having the first plurality of branches extending outward from the central region, each of the first plurality of branches being bent at a 90 degree angle. In some embodiments, the proof mass includes a closed loop wrapping around the anchor. In some embodiments, the one or more curved cantilevers laterally extend past one or more sidewalls of the second plurality of branches. In some embodiments, the curved outer surfaces of the one or more curved cantilevers include curved outer surfaces having a plurality of inflection points.

In other embodiments, the present disclosure relates to an integrated chip structure. The integrated chip structure includes a MEMS actuator disposed over a base substrate and having a frame coupled to a proof mass by one or more curved cantilevers; an image sensor integrated chip disposed on the MEMS actuator; and the one or more curved cantilevers including curved outer surfaces as viewed in a top-view of the one or more curved cantilevers, the curved outer surfaces having a plurality of inflection points respectively arranged between turning points as viewed in the top-view. In some embodiments, the MEMS actuator further includes an anchor coupled to the base substrate, the proof mass having a first plurality of fingers interleaved with a second plurality of fingers of the anchor. In some embodiments, the proof mass includes a first plurality of branches respectively having a first plurality of fingers; and the MEMS actuator further includes an anchor having a second plurality of branches respectively having a second plurality of fingers interleaved with the first plurality of branches. In some embodiments, the base substrate includes a printed circuit board. In some embodiments, the frame wraps around the proof mass in a closed loop. In some embodiments, the one or more curved cantilevers include four curved cantilevers respectively arranged along a different side of the proof mass. In some embodiments, the one or more curved cantilevers extend from a surface of the proof mass that faces a first direction to a surface of the frame that faces an opposing second direction, as viewed in the top-view of the proof mass. In some embodiments, the integrated chip structure further includes a package box surrounding the image sensor integrated chip and the MEMS actuator, the frame of the MEMS actuator being laterally coupled to a sidewall of the package box; and an optical system having one or more lenses disposed within the package box and configured to focus incident radiation to the image sensor integrated chip. In some embodiments, the integrated chip structure further includes a control circuitry disposed on the base substrate and configured to generate an electrical signal, the electrical signal being configured to move the proof mass in response to detected movement of the package box. In some embodiments, the one or more curved cantilevers respectively have a central region laterally surrounded on opposing sides by cantilever exterior regions, the cantilever exterior regions including a dielectric liner surrounding a core material, as viewed in a cross-sectional view.

In yet other embodiments, the present disclosure relates to a method for forming an integrated chip structure. The method includes providing a substrate having a lower semiconductor layer separated from a semiconductor layer by an insulating layer; patterning the semiconductor layer to form a plurality of curved trenches on opposing sides of a cantilever region, a first plurality of straight trenches on opposing sides of a proof mass region, and a second straight trench between a frame region and the plurality of curved trenches, wherein the plurality of curved trenches are separated from the first plurality of straight trenches by a first sacrificial region of the semiconductor layer and from the second straight trench by a second sacrificial region of the semiconductor layer; filling the plurality of curved trenches, the first plurality of straight trenches, and the second straight trench with one or more fill materials; and removing the first sacrificial region and the second sacrificial region to form one or more curved cantilevers separated from a proof mass and a frame by non-zero spaces, wherein the one or more curved cantilevers have curved sidewalls that continuously extend between the proof mass and the frame. In some embodiments, the method further includes removing the semiconductor layer from below a part of the proof mass to form a bottommost surface of the proof mass that is separated from the insulating layer by a second non-zero space. In some embodiments, the plurality of curved trenches, the first plurality of straight trenches, and the second straight trench have bottoms defined by horizontally extending surfaces of the semiconductor layer. In some embodiments, filling the plurality of curved trenches with one or more fill materials includes performing a thermal oxidation process to form a dielectric liner along sidewalls of the semiconductor layer defining the plurality of curved trenches; and depositing a polysilicon onto the dielectric liner to completely fill the plurality of curved trenches. In some embodiments, the method further includes attaching an image sensor integrated chip to the proof mass; and attaching the frame to a sidewall of a package box.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip structure, comprising:
  a MEMS (microelectromechanical systems) actuator, comprising:
    an anchor comprising a first plurality of branches extending outward from a central region of the anchor, the first plurality of branches respectively comprising a first plurality of fingers;
    a proof mass surrounding the anchor and comprising a second plurality of branches extending inward from an interior sidewall of the proof mass, the second plurality of branches respectively comprising a second plurality of fingers interleaved with the first plurality of fingers as viewed in a top-view;
    one or more curved cantilevers coupled between the proof mass and a frame, the frame wrapping around the proof mass; and
  wherein the one or more curved cantilevers comprise curved outer surfaces having one or more inflection points as viewed in the top-view.

2. The integrated chip structure of claim 1, wherein the anchor comprises a cross-shape having the first plurality of branches extending outward from the central region, each of the first plurality of branches being bent at a 90 degree angle.

3. The integrated chip structure of claim 1, wherein the proof mass comprises a closed loop wrapping around the anchor.

4. The integrated chip structure of claim 1, wherein the one or more curved cantilevers laterally extend past one or more sidewalls of the second plurality of branches.

5. The integrated chip structure of claim 1, wherein the curved outer surfaces of the one or more curved cantilevers comprise a plurality of inflection points.

6. An integrated chip structure, comprising:
  a MEMS actuator disposed over a base substrate and comprising a frame coupled to a proof mass by one or more curved cantilevers;
  an image sensor integrated chip disposed on the MEMS actuator;
  wherein the one or more curved cantilevers comprise curved outer surfaces as viewed in a top-view of the one or more curved cantilevers, the curved outer surfaces having a plurality of inflection points respectively arranged between turning points as viewed in the top-view; and
  wherein the one or more curved cantilevers respectively comprise a central region laterally surrounded on opposing sides by cantilever exterior regions, the cantilever exterior regions comprising a dielectric liner surrounding a core material, as viewed in a cross-sectional view.

7. The integrated chip structure of claim 6, wherein the MEMS actuator further comprises an anchor coupled to the base substrate, the proof mass comprising a first plurality of fingers interleaved with a second plurality of fingers of the anchor.

8. The integrated chip structure of claim 6,
  wherein the proof mass comprises a first plurality of branches respectively having a first plurality of fingers; and
  wherein the MEMS actuator further comprises an anchor including a second plurality of branches respectively having a second plurality of fingers interleaved with the first plurality of fingers.

9. The integrated chip structure of claim 6, wherein the base substrate comprises a printed circuit board.

10. The integrated chip structure of claim 6, wherein the frame wraps around the proof mass in a closed loop.

11. The integrated chip structure of claim 6, wherein the one or more curved cantilevers comprise four curved cantilevers respectively arranged along a different side of the proof mass.

12. The integrated chip structure of claim 6, wherein the one or more curved cantilevers extend from a surface of the proof mass that faces a first direction to a surface of the frame that faces an opposing second direction, as viewed in the top-view of the proof mass.

13. The integrated chip structure of claim 6, further comprising:
a package box surrounding the image sensor integrated chip and the MEMS actuator, wherein the frame of the MEMS actuator is laterally coupled to a sidewall of the package box; and
an optical system comprising one or more lenses disposed within the package box and configured to focus incident radiation to the image sensor integrated chip.

14. The integrated chip structure of claim 13, further comprising:
a control circuitry disposed on the base substrate and configured to generate an electrical signal, wherein the electrical signal is configured to move the proof mass in response to detected movement of the package box.

15. A method of forming an integrated chip structure, comprising:
providing a substrate having a lower semiconductor layer separated from a semiconductor layer by an insulating layer;
patterning the semiconductor layer to form a plurality of curved trenches on opposing sides of a cantilever region, a first plurality of straight trenches on opposing sides of a proof mass region, and a second straight trench between a frame region and the plurality of curved trenches, wherein the plurality of curved trenches are separated from the first plurality of straight trenches by a first sacrificial region of the semiconductor layer and from the second straight trench by a second sacrificial region of the semiconductor layer;
filling the plurality of curved trenches, the first plurality of straight trenches, and the second straight trench with one or more fill materials; and
removing the first sacrificial region and the second sacrificial region to form one or more curved cantilevers separated from a proof mass and a frame by non-zero spaces, wherein the one or more curved cantilevers have curved sidewalls that continuously extend between the proof mass and the frame.

16. The method of claim 15, further comprising:
removing the semiconductor layer from below a part of the proof mass to form a bottommost surface of the proof mass that is separated from the insulating layer by a second non-zero space.

17. The method of claim 15, wherein the plurality of curved trenches, the first plurality of straight trenches, and the second straight trench have bottoms defined by horizontally extending surfaces of the semiconductor layer.

18. The method of claim 15, wherein filling the plurality of curved trenches with the one or more fill materials comprises:
performing a thermal oxidation process to form a dielectric liner along sidewalls of the semiconductor layer defining the plurality of curved trenches; and
depositing a polysilicon onto the dielectric liner to completely fill the plurality of curved trenches.

19. The method of claim 15, further comprising:
attaching an image sensor integrated chip to the proof mass; and
attaching the frame to a sidewall of a package box.

20. The method of claim 15, wherein the first sacrificial region and the second sacrificial region are removed using a wet etchant that etches the substrate at a higher etching rate than the one or more fill materials.

* * * * *